United States Patent
Ayrapetian et al.

(10) Patent No.: US 11,812,237 B2
(45) Date of Patent: Nov. 7, 2023

(54) CASCADED ADAPTIVE INTERFERENCE CANCELLATION ALGORITHMS

(71) Applicant: Amazon Technologies, Inc., Seattle, WA (US)

(72) Inventors: Robert Ayrapetian, Morgan Hill, CA (US); Philip Ryan Hilmes, Sunnyvale, CA (US); Mohamed Mansour, Cupertino, CA (US); Carlo Murgia, Santa Clara, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/553,976

(22) Filed: Dec. 17, 2021

(65) Prior Publication Data

US 2022/0109929 A1   Apr. 7, 2022

Related U.S. Application Data

(62) Division of application No. 16/180,890, filed on Nov. 5, 2018, now Pat. No. 11,277,685.

(51) Int. Cl.

| | |
|---|---|
| *G10L 21/02* | (2013.01) |
| *H04R 3/00* | (2006.01) |
| *H04R 5/04* | (2006.01) |
| *H04R 5/027* | (2006.01) |
| *G10L 21/0224* | (2013.01) |
| *G06F 3/16* | (2006.01) |
| *G10L 21/0272* | (2013.01) |

(Continued)

(52) U.S. Cl.
CPC ............ *H04R 3/005* (2013.01); *G06F 3/167* (2013.01); *G10L 21/02* (2013.01); *G10L 21/0208* (2013.01); *G10L 21/0224* (2013.01); *G10L 21/0272* (2013.01); *H04R 5/027* (2013.01); *H04R 5/04* (2013.01); *G10L 25/51* (2013.01); *G10L 25/78* (2013.01); *G10L 25/93* (2013.01); *G10L 2021/02082* (2013.01); *G10L 2021/02166* (2013.01); *H03H 21/0012* (2013.01)

(58) Field of Classification Search
None
See application file for complete search history.

(56) References Cited

U.S. PATENT DOCUMENTS

| | | | |
|---|---|---|---|
| 10,354,635 B2 * | 7/2019 | Kemmerer | .......... G10L 21/0208 |
| 10,366,701 B1 * | 7/2019 | Su | ........................ G10L 21/0216 |

(Continued)

*Primary Examiner* — Richard Z Zhu
(74) *Attorney, Agent, or Firm* — PIERCE ATWOOD LLP

(57) ABSTRACT

Techniques for improving adaptive interference cancellation (AIC) using cascaded AIC algorithms are described. To improve an accuracy of detecting speech, a device may perform a first stage of AIC to generate isolated audio data and may generate speech mask data indicating time windows when speech is detected in the isolated audio data. Based on the speech mask data, the device may perform second AIC to generate output audio data, with adaptation of the adaptive filter enabled when the speech is not detected and disabled when the speech is detected. Thus, the first AIC improves the accuracy with which the device detects that speech is present and the second AIC reduces distortion in the output audio data by not updating filter coefficient values when the speech is present. The first AIC may use playback audio data, microphone audio data or beamformed audio data as reference signals.

17 Claims, 24 Drawing Sheets

(51) Int. Cl.
*G10L 21/0208* (2013.01)
*G10L 21/0216* (2013.01)
*G10L 25/93* (2013.01)
*G10L 25/51* (2013.01)
*H03H 21/00* (2006.01)
*G10L 25/78* (2013.01)

(56) References Cited

U.S. PATENT DOCUMENTS

2006/0015331 A1* 1/2006 Hui .................... G10L 21/0272
 704/227
2019/0130885 A1* 5/2019 Kemmerer ............. H04R 3/005

* cited by examiner

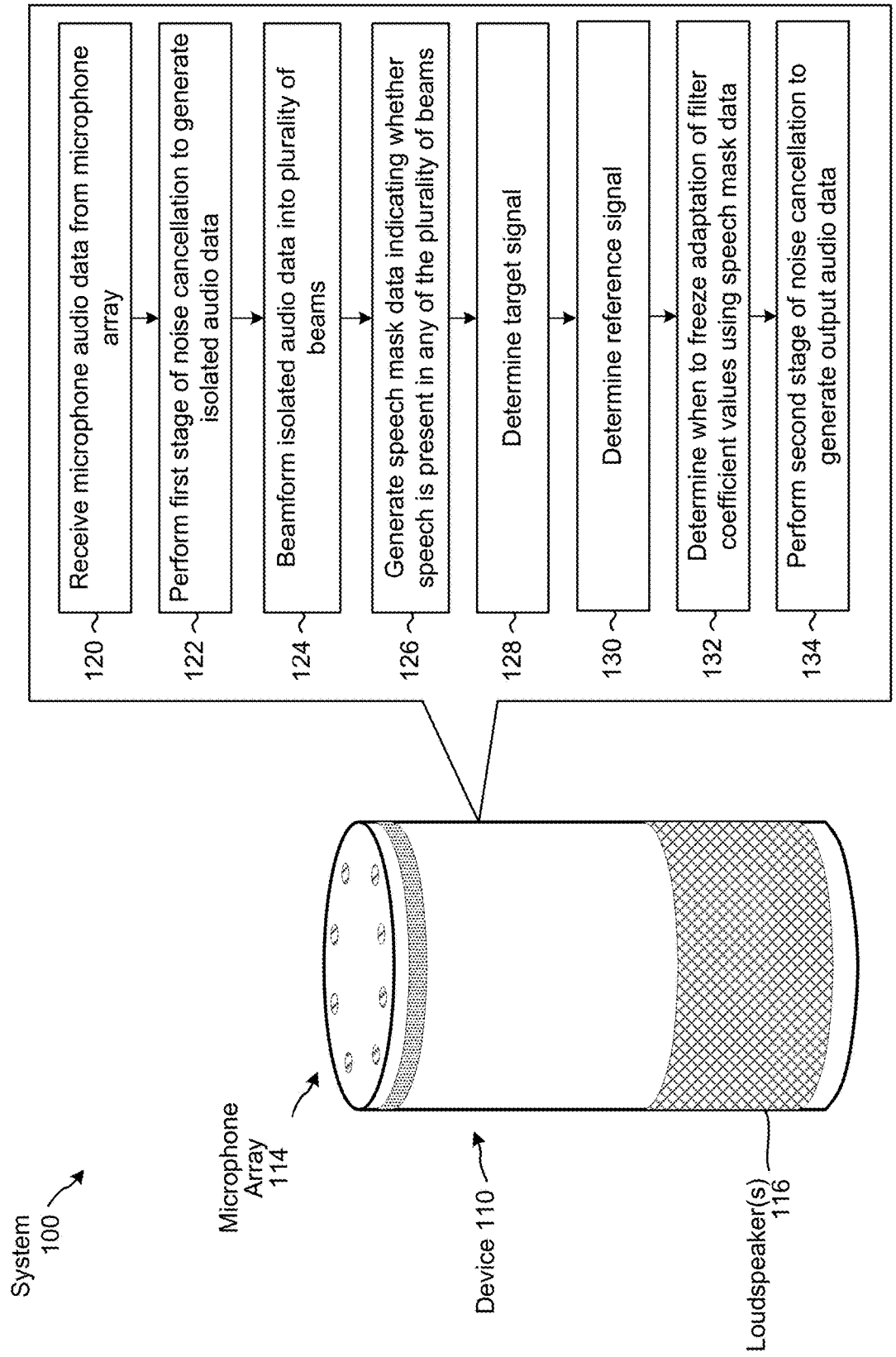

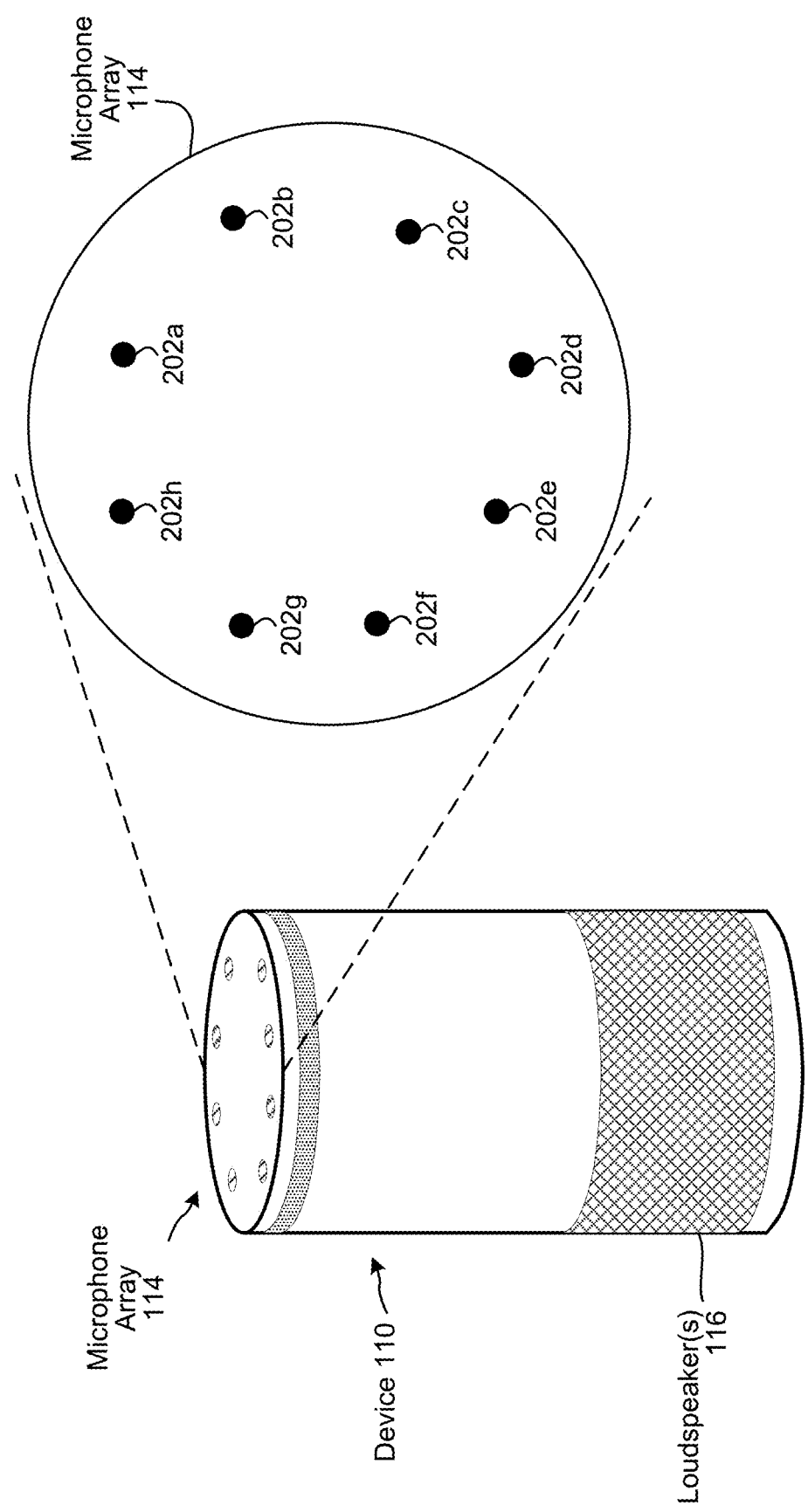

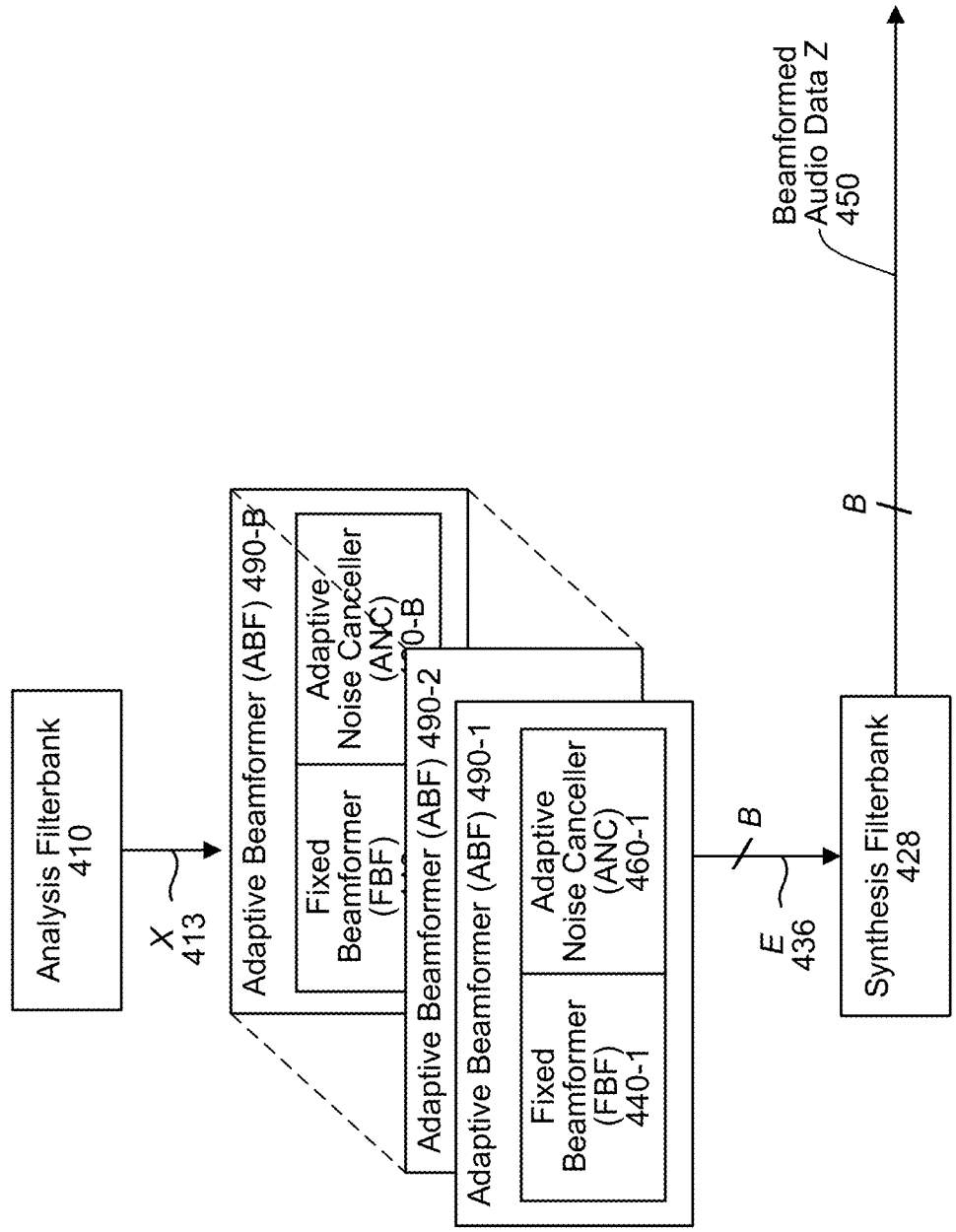

FIG. 7A
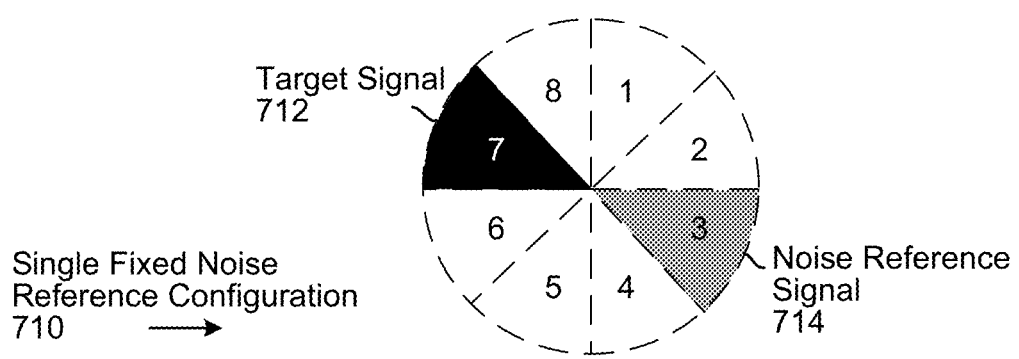
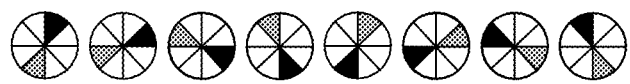
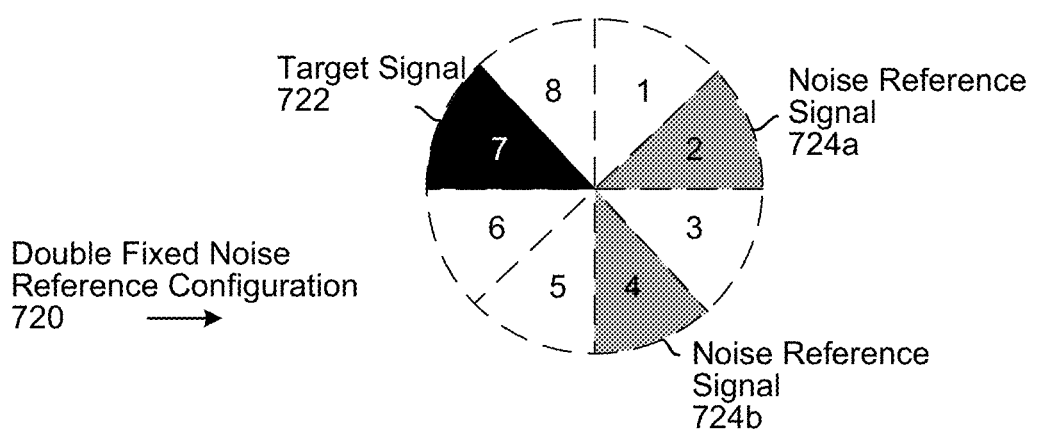
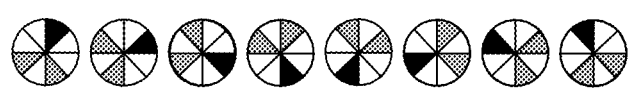

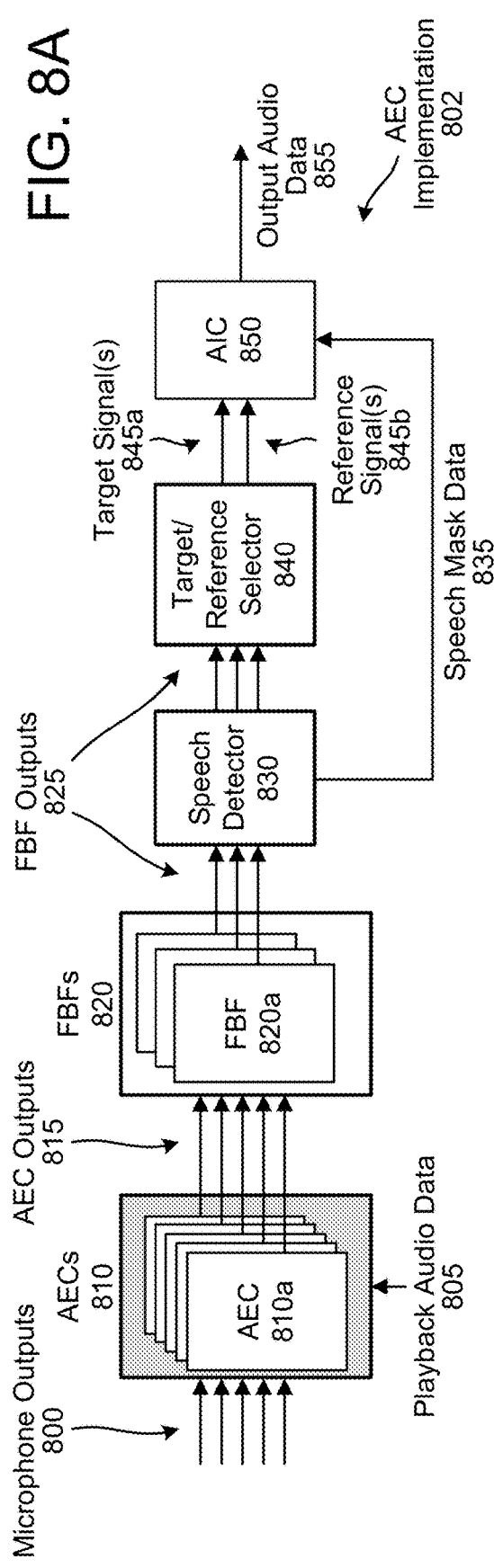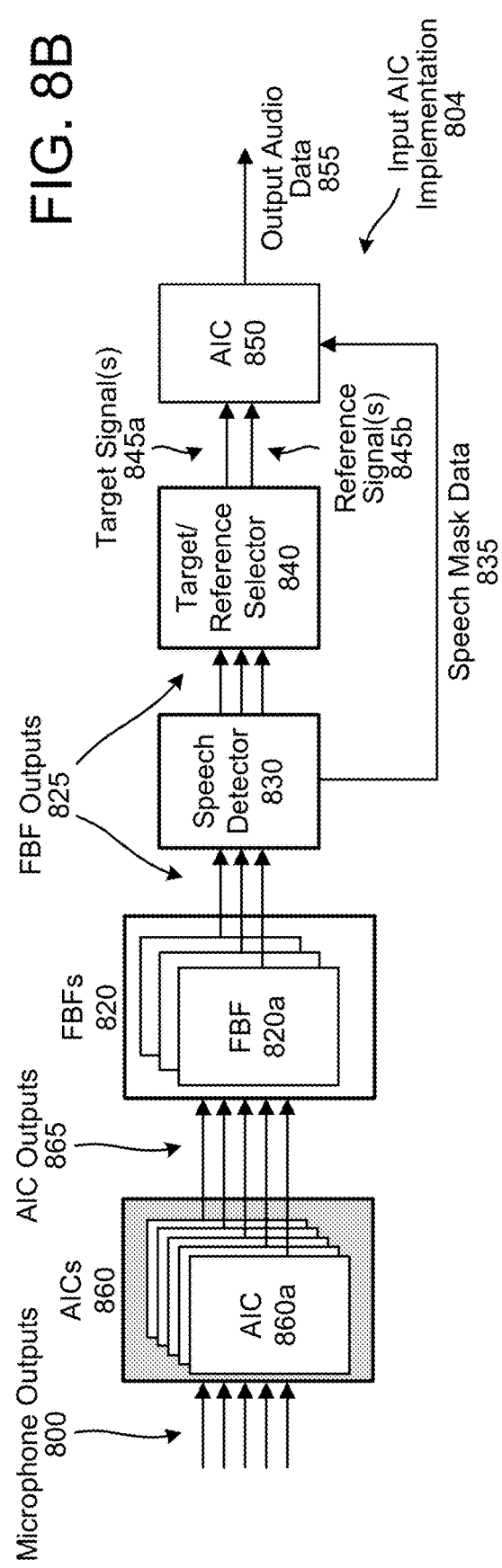

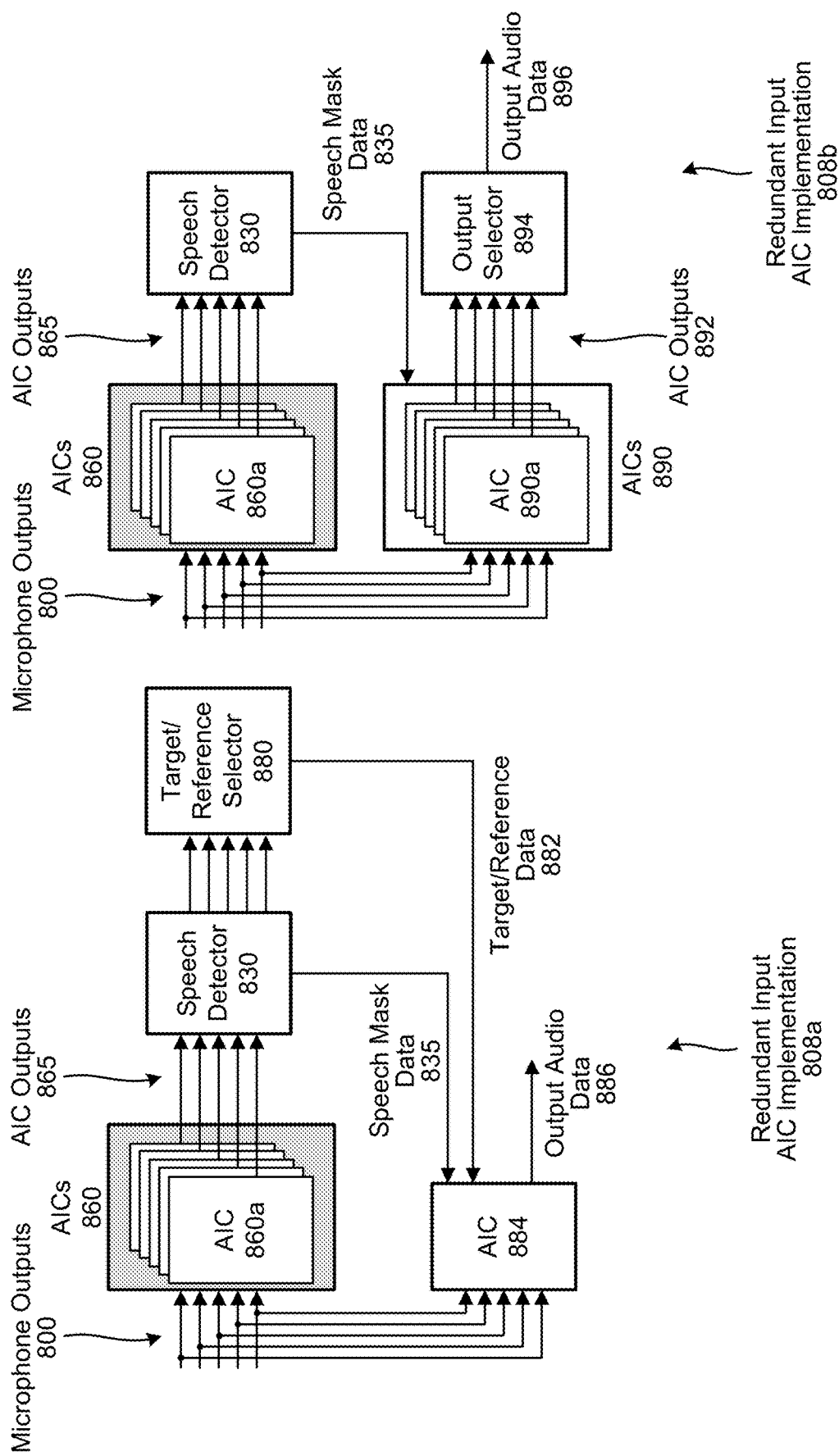

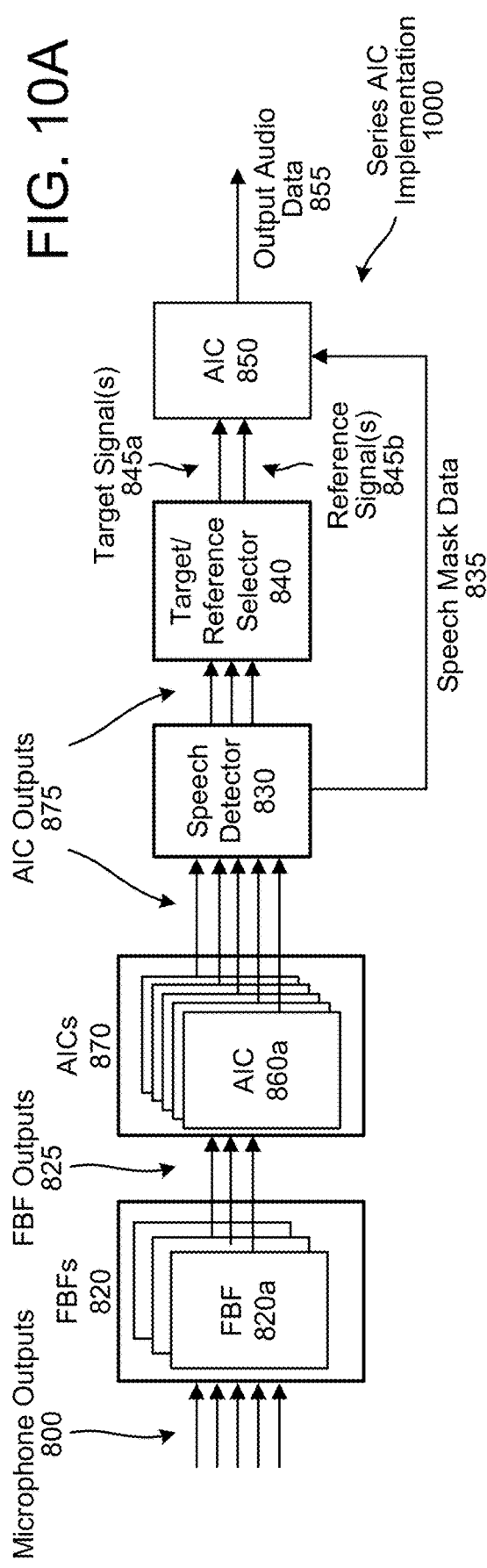
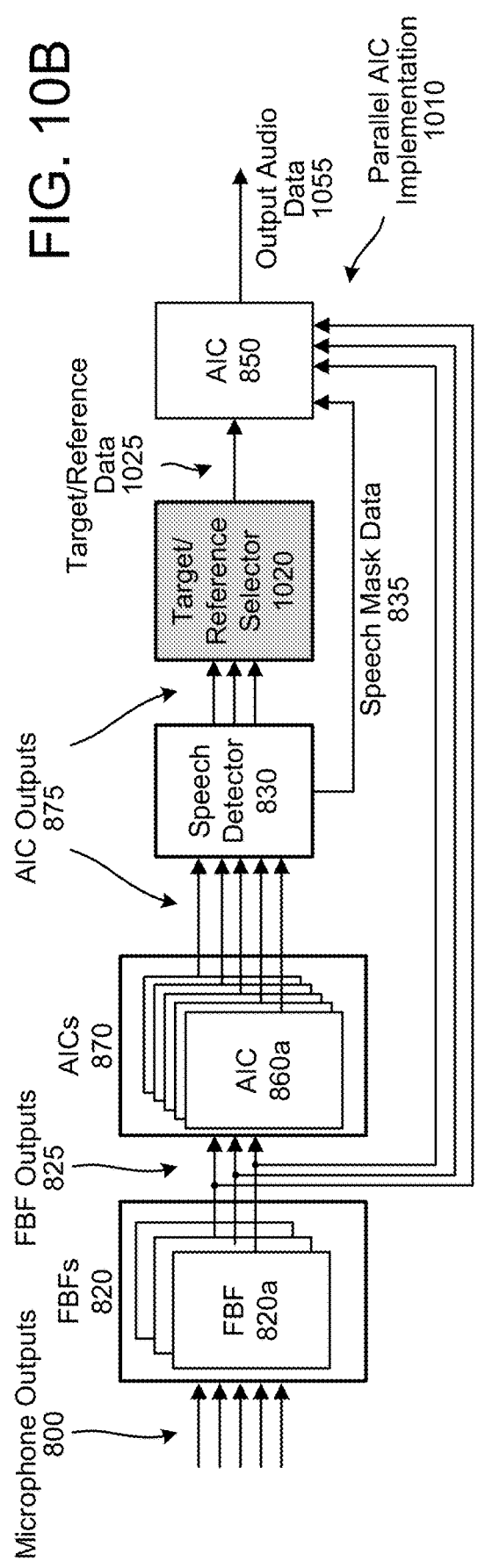

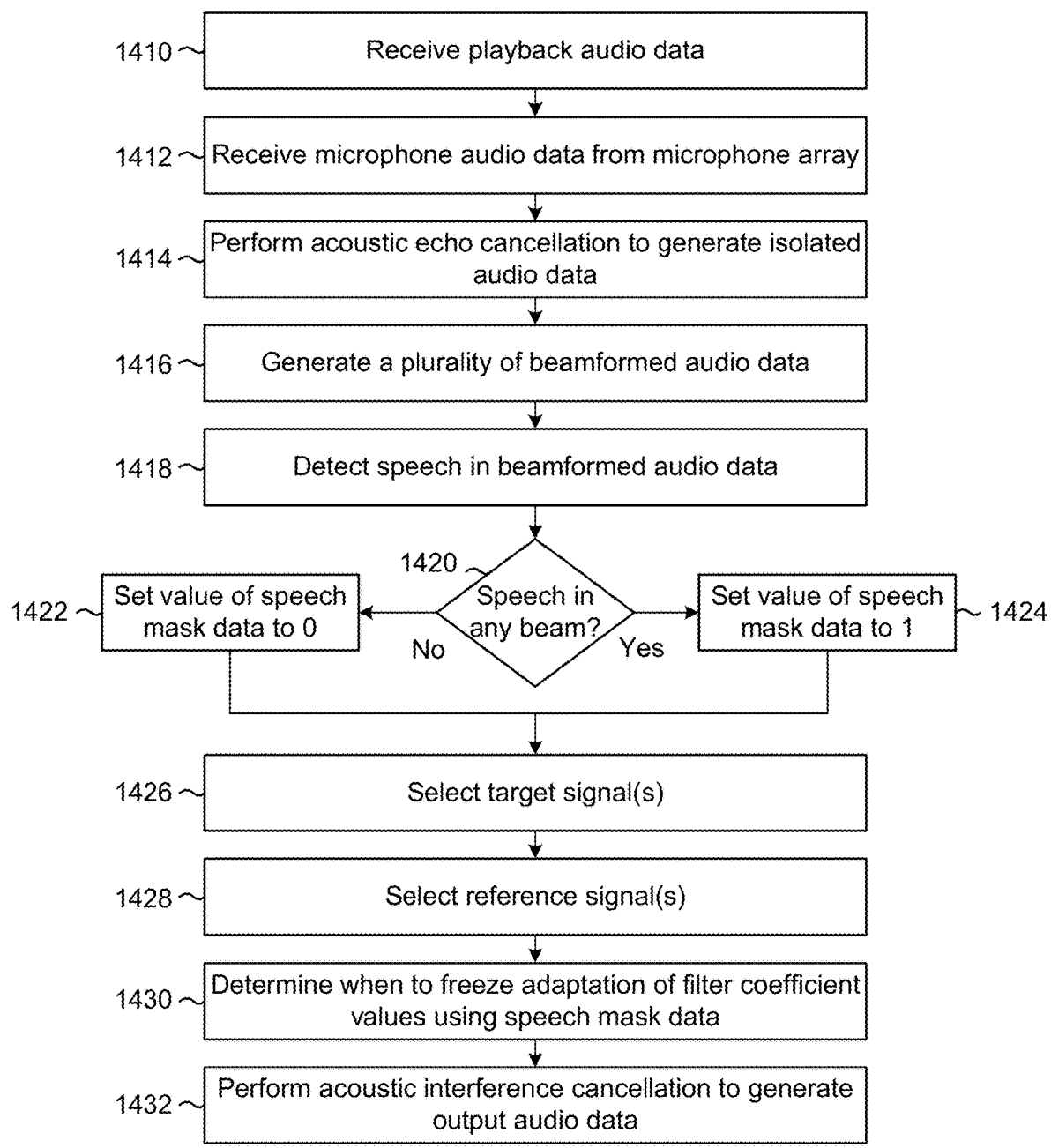

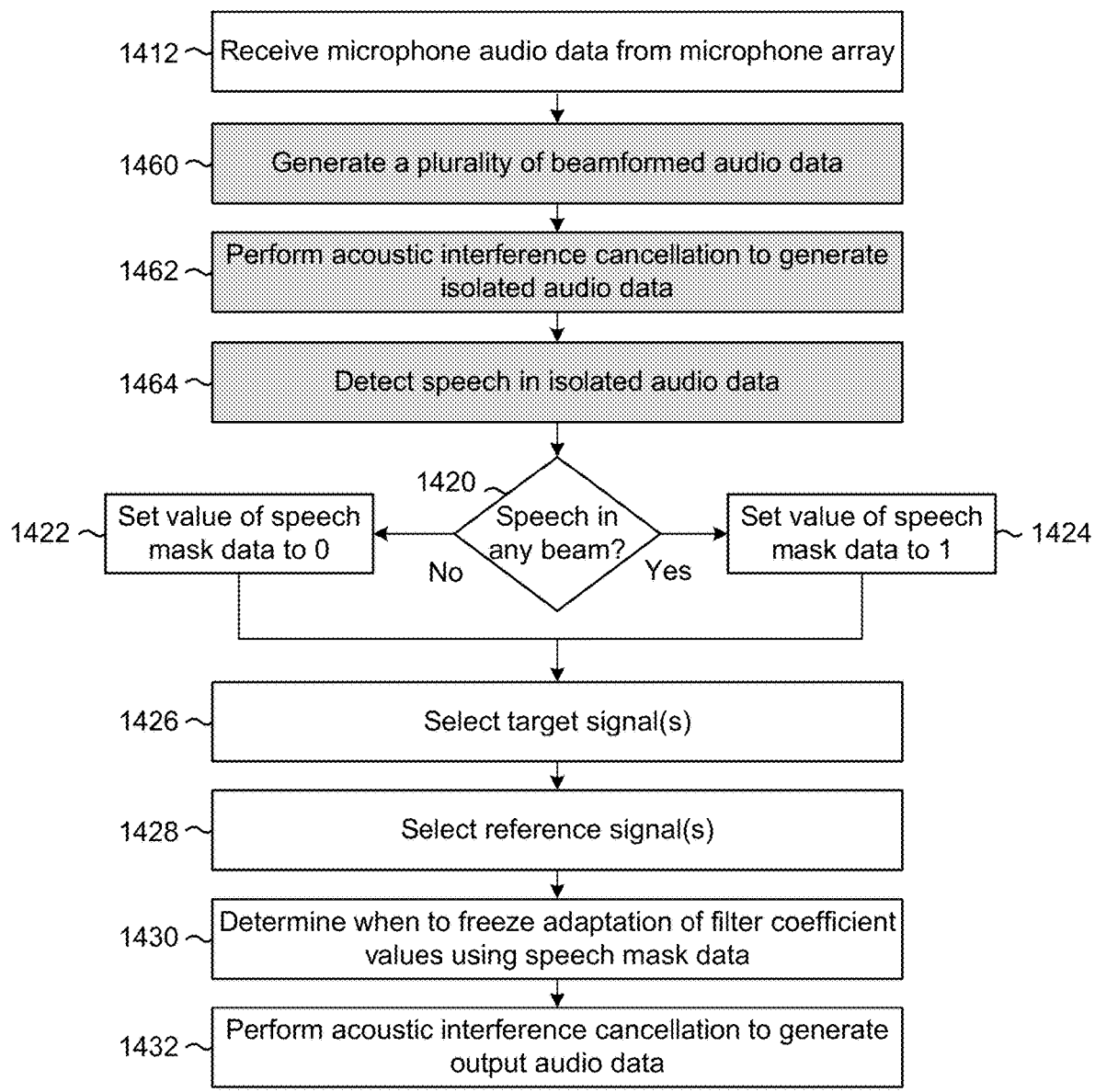

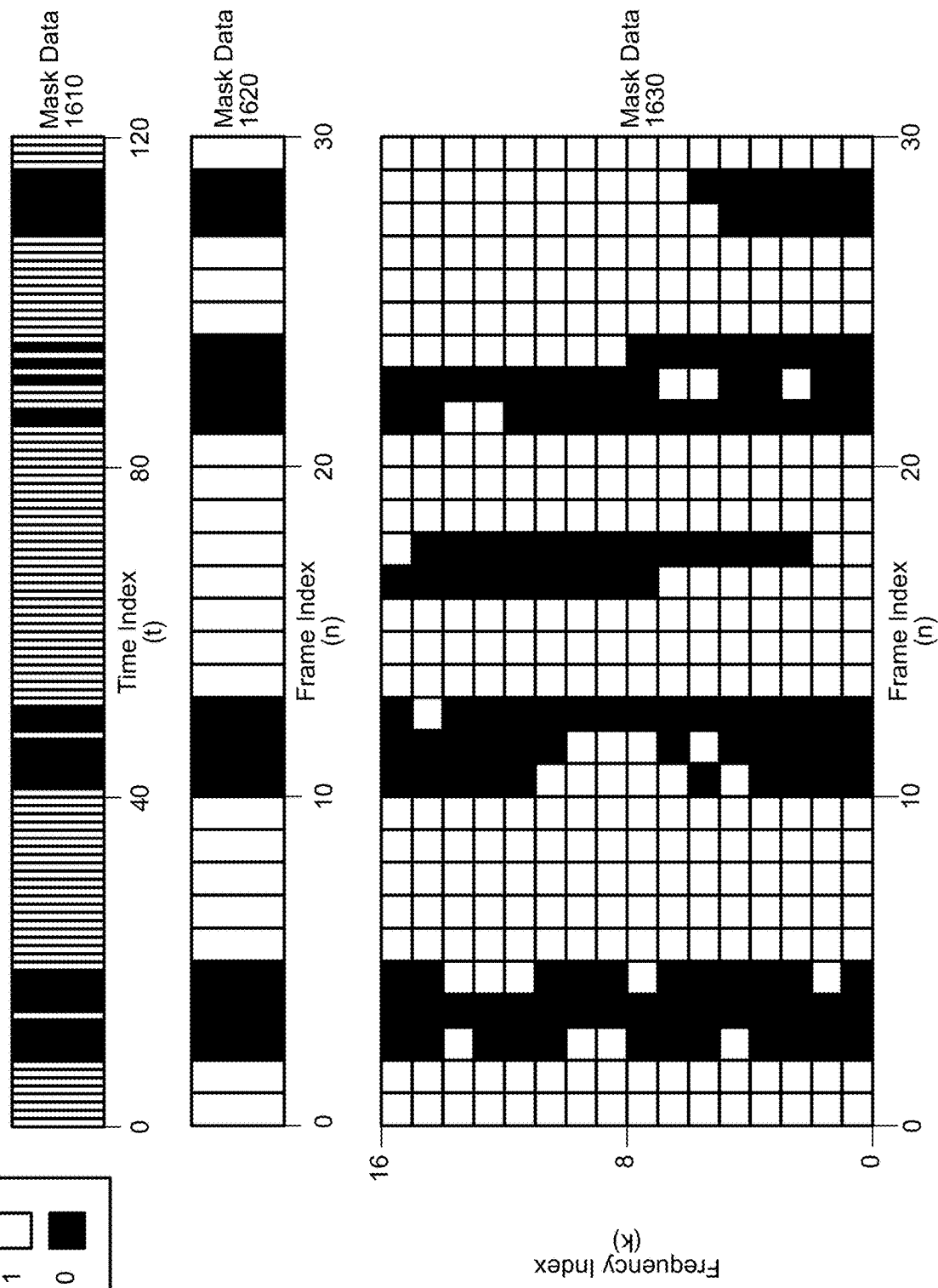
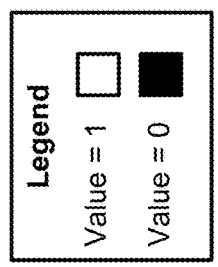
FIG. 16

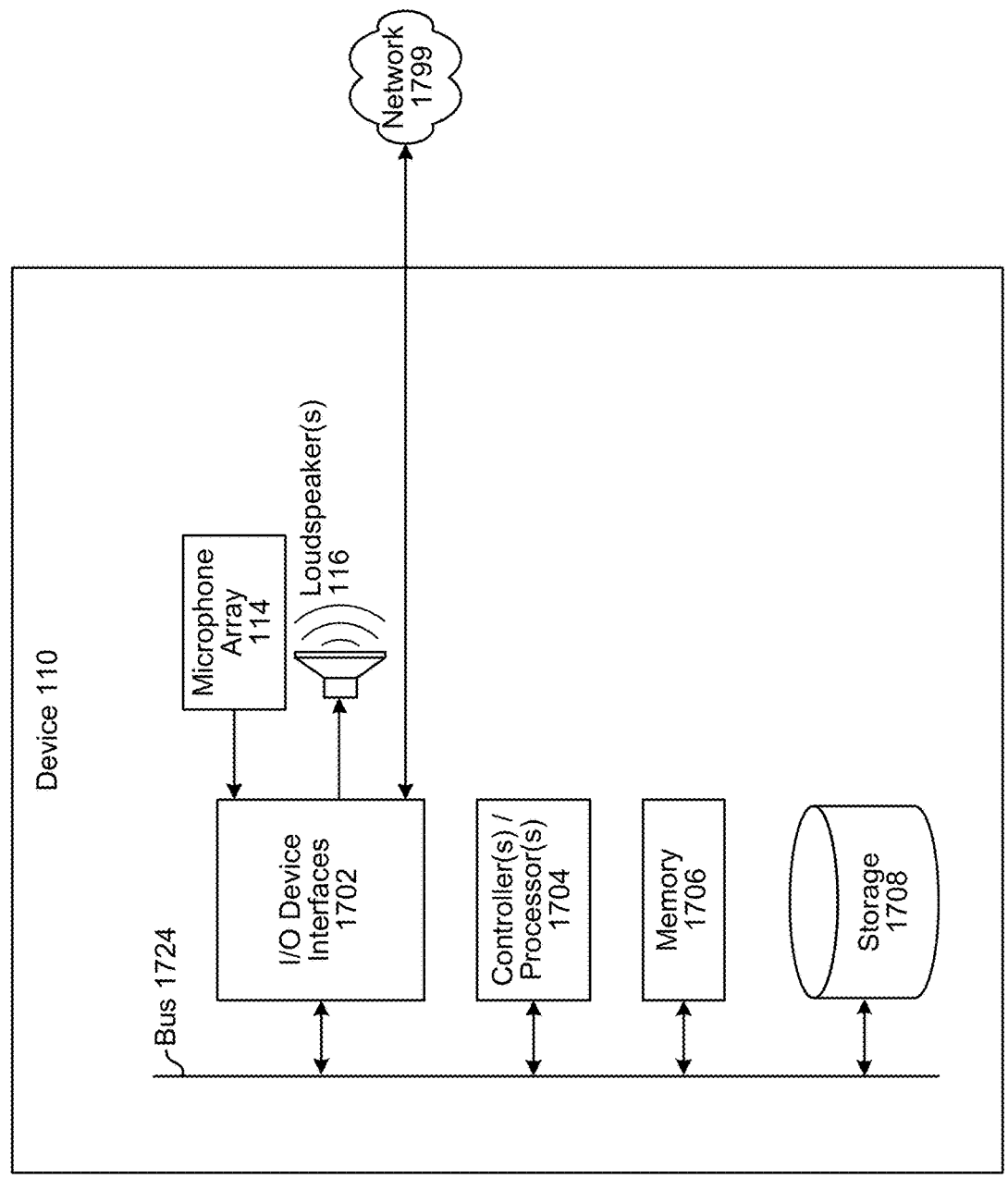

CASCADED ADAPTIVE INTERFERENCE CANCELLATION ALGORITHMS

CROSS-REFERENCE TO RELATED APPLICATIONS

This application is a divisional of, and claims the benefit of priority under 35 U.S.C. § 120 to, U.S. application Ser. No. 16/180,890, filed Nov. 5, 2018, and entitled CASCADED ADAPTIVE INTERFERENCE CANCELLATION ALGORITHMS, in the name of Robert Ayrapetian et al., the entire contents of which are incorporated herein by reference.

BACKGROUND

With the advancement of technology, the use and popularity of electronic devices has increased considerably. Electronic devices are commonly used to capture and process audio data.

BRIEF DESCRIPTION OF DRAWINGS

For a more complete understanding of the present disclosure, reference is now made to the following description taken in conjunction with the accompanying drawings.

FIG. 1 illustrates a cascaded adaptive interference cancellation system according to embodiments of the present disclosure.

FIG. 2 illustrates a microphone array according to embodiments of the present disclosure.

FIG. 6 illustrates a multiple FBF/ABF beamformer unit configuration for each beam according to embodiments of the present disclosure.

FIGS. 7A-7B illustrate examples of noise reference signals according to embodiments of the present disclosure.

FIGS. 8A-8E illustrate examples of cascaded adaptive interference cancellation systems according to embodiments of the present disclosure.

FIGS. 10A-10B illustrate examples of series and parallel implementations according to embodiments of the present disclosure.

FIGS. 14A-14C are flowcharts conceptually illustrating example methods for generating output audio using cascaded adaptive interference algorithms according to embodiments of the present disclosure.

FIG. 16 illustrates examples of speech mask data according to embodiments of the present disclosure.

FIG. 17 is a block diagram conceptually illustrating example components of a device according to embodiments of the present disclosure.

DETAILED DESCRIPTION

Figure 3A:
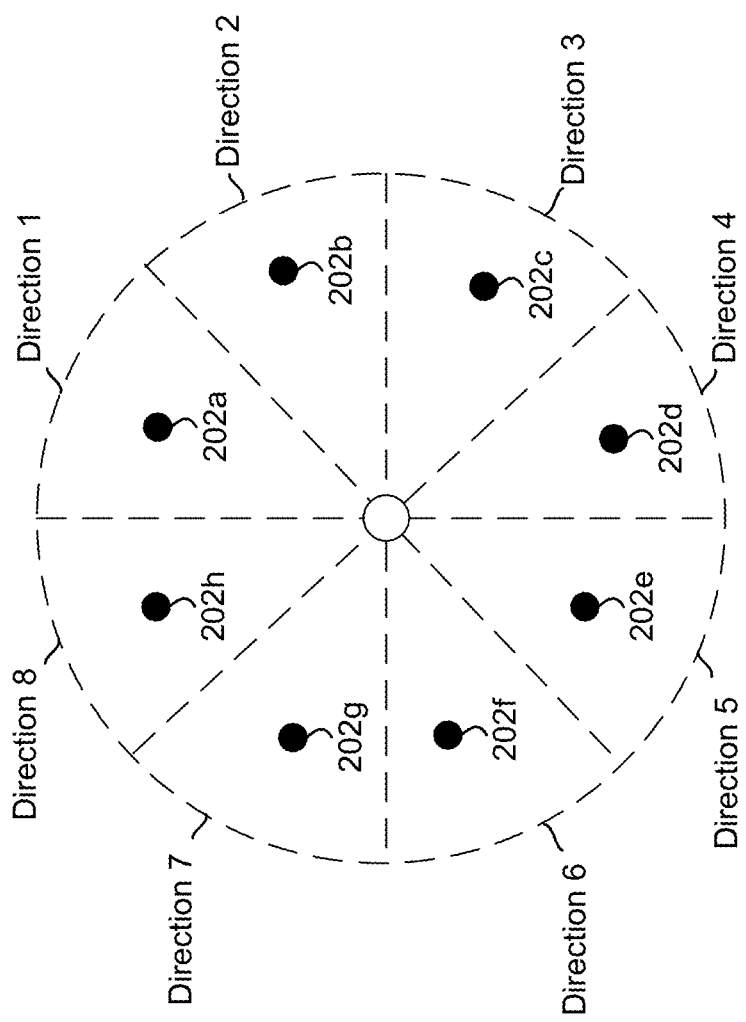
FIG. 3A illustrates associating directions with microphones of a microphone array according to embodiments of the present disclosure.

Electronic devices may be used to capture audio and process audio data. The audio data may be used for voice commands and/or sent to a remote device as part of a communication session. To process voice commands from a particular user or to send audio data that only corresponds to the particular user, the device may attempt to isolate desired speech associated with the user from undesired speech associated with other users and/or other sources of noise, such as audio generated by loudspeaker(s) or ambient noise in an environment around the device. An electronic device may perform acoustic echo cancellation to remove, from the audio data, an "echo" signal corresponding to the audio generated by the loudspeaker(s), thus isolating the desired speech to be used for voice commands and/or the communication session from whatever other audio may exist in the environment of the user.

However, some techniques for acoustic echo cancellation can only be performed when the device knows the reference audio data being sent to the loudspeaker, and therefore these techniques cannot remove undesired speech, ambient noise and/or echo signals from loudspeakers not controlled by the device. Other techniques for acoustic echo cancellation solve this problem by estimating the noise (e.g., undesired speech, echo signal from the loudspeaker, and/or ambient noise) based on the audio data captured by a microphone array. For example, these techniques may include fixed beamformers that beamform the audio data (e.g., separate the audio data into portions that corresponds to individual directions) and then perform the acoustic echo cancellation (which may be referred to as adaptive interference cancellation when using beamformed audio data) using a target signal associated with one direction and a reference signal associated with a different direction (or multiple directions). However, while the adaptive interference cancellation may remove noise, it may inadvertently attenuate desired speech. This attenuation may be avoided when the desired speech is detected, but the device may be unable to detect the desired speech when the desired speech is obscured by a noise signal.

To improve noise cancellation, devices, systems and methods are disclosed that reduce attenuation of the desired speech (e.g., local speech in proximity to a device) by detecting speech after a first stage of noise cancellation and then disabling adaptation of an adaptive filter in a second stage of noise cancellation when the speech is detected. For example, to improve an accuracy associated with detecting speech, a system may perform first noise cancellation to generate first output audio data. The system may then determine whether the local speech is present in the first output audio data and may generate speech mask data indicating time windows in which the local speech is present. Based on the speech mask data, the system may perform second noise cancellation to generate second output audio data, with adaptation of the adaptive filter enabled when the speech is not detected and disabled when the speech is detected.

FIG. 1 illustrates a cascaded adaptive interference cancellation system according to embodiments of the present disclosure. As illustrated in FIG. 1, the device 110 may include a microphone array 114 and one or more loudspeaker(s) 116. However, the disclosure is not limited thereto and the device 110 may include additional components without departing from the disclosure.

The device 110 may operate using a microphone array 114 comprising multiple microphones, where beamforming techniques may be used to isolate desired audio including speech. In audio systems, beamforming refers to techniques that are used to isolate audio from a particular direction in a multi-directional audio capture system. Beamforming may be particularly useful when filtering out noise from non-desired directions. Beamforming may be used for various tasks, including isolating voice commands to be executed by a speech-processing system.

One technique for beamforming involves boosting audio received from a desired direction while dampening audio received from a non-desired direction. In one example of a beamformer system, a fixed beamformer unit employs a filter-and-sum structure to boost an audio signal that originates from the desired direction (sometimes referred to as the look-direction) while largely attenuating audio signals that original from other directions. A fixed beamformer unit may effectively eliminate certain diffuse noise (e.g., undesirable audio), which is detectable in similar energies from various directions, but may be less effective in eliminating noise emanating from a single source in a particular non-desired direction. The beamformer unit may also incorporate an adaptive beamformer unit/noise canceller that can adaptively cancel noise from different directions depending on audio conditions.

In some examples, the device 110 may receive playback audio data and may generate output audio corresponding to the playback audio data using the one or more loudspeaker(s) 116. While generating the output audio, the device 110 may capture input audio data using the microphone array 114. In addition to capturing speech (e.g., the input audio data includes a representation of speech or a representation of an utterance), the device 110 may capture a portion of the output audio generated by the loudspeaker(s) 116 (e.g., representation of playback audio data), which may be referred to as an "echo" or echo signal. Conventional systems isolate the speech in the input audio data by performing acoustic echo cancellation (AEC) to remove the echo signal from the input audio data. For example, conventional acoustic echo cancellation may generate a reference signal based on the playback audio data and may remove the reference signal from the input audio data to generate output audio data representing the speech.

As an alternative to generating the reference signal based on the playback audio data, Adaptive Reference Algorithm (ARA) processing may generate an adaptive reference signal based on the input audio data. To illustrate an example, the ARA processing may perform beamforming using the input audio data to generate a plurality of audio signals (e.g., beamformed audio data) corresponding to particular directions. For example, the plurality of audio signals may include a first audio signal corresponding to a first direction, a second audio signal corresponding to a second direction, a third audio signal corresponding to a third direction, and so on. The ARA processing may select the first audio signal as a target signal (e.g., the first audio signal includes a representation of speech) and the second audio signal as a reference signal (e.g., the second audio signal includes a representation of the echo and/or other acoustic noise) and may perform AEC by removing the reference signal from the target signal. As the input audio data is not limited to the echo signal, the ARA processing may remove other acoustic noise represented in the input audio data in addition to removing the echo. Therefore, the ARA processing may be referred to as performing AEC, adaptive noise cancellation (ANC), and/or adaptive interference cancellation (AIC) (e.g., adaptive acoustic interference cancellation) without departing from the disclosure.

As discussed in greater detail below, the device 110 may include an adaptive beamformer and may be configured to perform AEC/ANC/AIC using the ARA processing to isolate the speech in the input audio data. The adaptive beamformer may dynamically select target signal(s) and/or reference signal(s). Thus, the target signal(s) and/or the reference signal(s) may be continually changing over time based on speech, acoustic noise(s), ambient noise(s), and/or the like in an environment around the device 110. For example, the adaptive beamformer may select the target signal(s) by detecting speech, based on signal strength values or signal quality metrics (e.g., signal-to-noise ratio (SNR) values, average power values, etc.), and/or using other techniques or inputs, although the disclosure is not limited thereto. As an example of other techniques or inputs, the device 110 may capture video data corresponding to the input audio data, analyze the video data using computer vision processing (e.g., facial recognition, object recognition, or the like) to determine that a user is associated with a first direction, and select the target signal(s) by selecting the first audio signal corresponding to the first direction. Similarly, the adaptive beamformer may identify the reference signal(s) based on the signal strength values and/or using other inputs without departing from the disclosure. Thus, the target signal(s) and/or the reference signal(s) selected by the adaptive beamformer may vary, resulting in different filter coefficient values over time.

As discussed above, the device 110 may perform beamforming (e.g., perform a beamforming operation to generate beamformed audio data corresponding to individual directions). As used herein, beamforming (e.g., performing a beamforming operation) corresponds to generating a plurality of directional audio signals (e.g., beamformed audio data) corresponding to individual directions relative to the microphone array. For example, the beamforming operation may individually filter input audio signals generated by multiple microphones in the microphone array 114 (e.g., first audio data associated with a first microphone, second audio data associated with a second microphone, etc.) in order to separate audio data associated with different directions. Thus, first beamformed audio data corresponds to audio data associated with a first direction, second beamformed audio data corresponds to audio data associated with a second direction, and so on. In some examples, the device 110 may generate the beamformed audio data by boosting an audio signal originating from the desired direction (e.g., look direction) while attenuating audio signals that originate from other directions, although the disclosure is not limited thereto.

To perform the beamforming operation, the device 110 may apply directional calculations to the input audio signals. In some examples, the device 110 may perform the directional calculations by applying filters to the input audio signals using filter coefficients associated with specific directions. For example, the device 110 may perform a first directional calculation by applying first filter coefficients to the input audio signals to generate the first beamformed audio data and may perform a second directional calculation by applying second filter coefficients to the input audio signals to generate the second beamformed audio data.

The filter coefficients used to perform the beamforming operation may be calculated offline (e.g., preconfigured ahead of time) and stored in the device 110. For example, the device 110 may store filter coefficients associated with hundreds of different directional calculations (e.g., hundreds of specific directions) and may select the desired filter coefficients for a particular beamforming operation at runtime (e.g., during the beamforming operation). To illustrate an example, at a first time the device 110 may perform a first beamforming operation to divide input audio data into 36 different portions, with each portion associated with a specific direction (e.g., 10 degrees out of 360 degrees) relative to the device 110. At a second time, however, the device 110 may perform a second beamforming operation to divide input audio data into 6 different portions, with each portion associated with a specific direction (e.g., 60 degrees out of 360 degrees) relative to the device 110.

These directional calculations may sometimes be referred to as "beams" by one of skill in the art, with a first directional calculation (e.g., first filter coefficients) being referred to as a "first beam" corresponding to the first direction, the second directional calculation (e.g., second filter coefficients) being referred to as a "second beam" corresponding to the second direction, and so on. Thus, the device 110 stores hundreds of "beams" (e.g., directional calculations and associated filter coefficients) and uses the "beams" to perform a beamforming operation and generate a plurality of beamformed audio signals. However, "beams" may also refer to the output of the beamforming operation (e.g., plurality of beamformed audio signals). Thus, a first beam may correspond to first beamformed audio data associated with the first direction (e.g., portions of the input audio signals corresponding to the first direction), a second beam may correspond to second beamformed audio data associated with the second direction (e.g., portions of the input audio signals corresponding to the second direction), and so on. For ease of explanation, as used herein "beams" refer to the beamformed audio signals that are generated by the beamforming operation. Therefore, a first beam corresponds to first audio data associated with a first direction, whereas a first directional calculation corresponds to the first filter coefficients used to generate the first beam.

In some situations, the ARA processing may inadvertently attenuate and/or distort desired speech. To improve the ARA processing, the device 110 may detect that the speech is present and disable adaptation of an adaptive filter when the speech is detected. As will be described in greater detail below with regard to FIGS. 8A-8E, the device 110 may improve speech detection by performing a first stage of noise cancellation (e.g., AEC or AIC). The output of the first stage of noise cancellation improves a signal-to-noise ratio (SNR) and enables the device 110 to more accurately detect the presence of speech. The first stage of noise cancellation may be implemented in multiple ways, including performing AEC using playback audio data as reference signal(s), performing AIC using microphone audio data as reference signal(s), and/or performing AIC using beamformed audio data as reference signal(s).

As illustrated in FIG. 1, the device 110 may receive (120) microphone audio data corresponding to audio captured by the microphone array 114. The device 110 may perform (122) a first stage of noise cancellation to generate isolated audio data. The device 110 may perform noise cancellation separately for each microphone included in the microphone array 114. In a first example, the device 110 may perform AEC to remove playback audio data from each of the microphone signals included in the microphone audio data. In a second example, the device 110 may select each of the microphone signals as a target signal, may select some of the microphone signals as reference signal(s) for each of the target signals, and may perform AIC to remove the reference signal(s) from each of the target signals.

After generating the isolated audio data, the device 110 may then beamform (124) the isolated audio data into a plurality of beams (e.g., perform a beamforming operation to generate beamformed audio data). As used herein, the term beam may refer to particular audio data corresponding to the isolated audio data, where the particular audio data of a beam corresponds to a particular direction. Thus, each beam may include audio data corresponding to a particular direction relative to the device 110. So a beamforming unit or component of the device (such as adaptive beamformer (ABF) unit 490 discussed below) may divide the isolated audio data into different beams of audio data, each corresponding to a direction.

In a third example, the device 110 may switch the order of steps 122 and 124. For example, the device 110 may perform beamforming first and then perform the first stage of noise cancellation to generate the isolated audio data. To illustrate an example, the device 110 may beamform the microphone audio data into a plurality of beams and then perform AIC using the plurality of beams. For example, the device 110 may select each of the beams as a target signal, may select some of the beams as reference signal(s) for each of the target signals, and may perform AIC to remove the reference signal(s) from each of the target signals.

After performing the first stage of noise cancellation and beamforming to generate a plurality of beams, the device 110 may generate (126) speech mask data indicating whether speech is present in any of the plurality of beams. For example, the device 110 may process each of the beams in the plurality of beams to detect speech using signal quality metrics (e.g., signal quality values), a deep neural network (DNN) (e.g., a first model), and/or the like. If speech is detected in any of the beams, the device 110 may indicate that speech is detected in a corresponding value of the speech mask data. Thus, the speech mask data may be used to determine when speech is detected or not detected.

The device 110 may determine (128) a target signal, may determine (130) a reference signal, may determine (132) when to freeze adaptation of filter coefficient values using the speech mask data, and may generate (134) output audio data based on the target signal and the reference signal. For example, the device 110 may select first beamformed audio data as the target signal, may select second beamformed audio data as the reference signal, and may generate the output audio data by removing at least a portion of the second beamformed audio data from the first beamformed audio data. While FIG. 1 illustrates the device 110 selecting a single target signal and a single reference signal, the disclosure is not limited thereto and the device 110 may determine one or more target signal(s) and/or one or more reference signal(s) without departing from the disclosure.

By performing the first stage of noise cancellation, the device 110 may remove at least a portion of the echo signal and/or noise signals from the input audio data. Similarly, performing the beamforming and performing the second stage of noise cancellation (e.g., performing adaptive interference cancellation by applying the adaptive reference algorithm (ARA) processing) to remove the reference signal from the target signal cancels and/or attenuates the echo signal, the representation of the first acoustic noise and/or the representation of the ambient noise, without canceling or substantially attenuating the representation of the speech. Thus, the device 110 may isolate the speech and generate the output audio data.

Figure 3B:
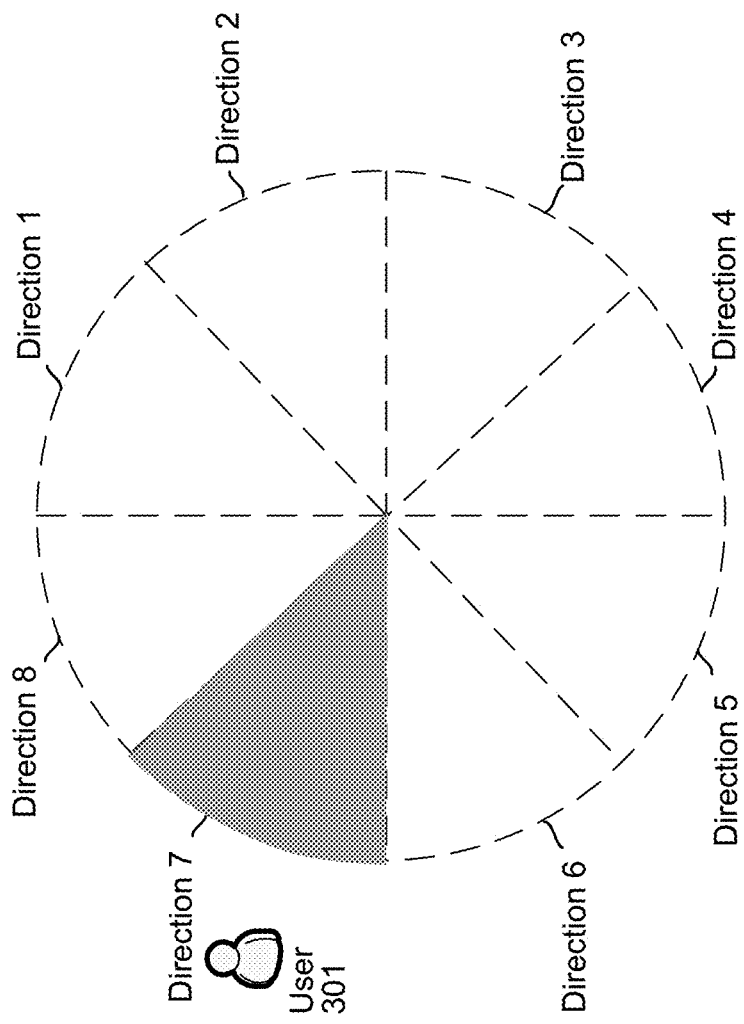
FIGS. 3B and 3C illustrate isolating audio from a direction to focus on a desired audio source according to embodiments of the present disclosure.
Figure 3C:
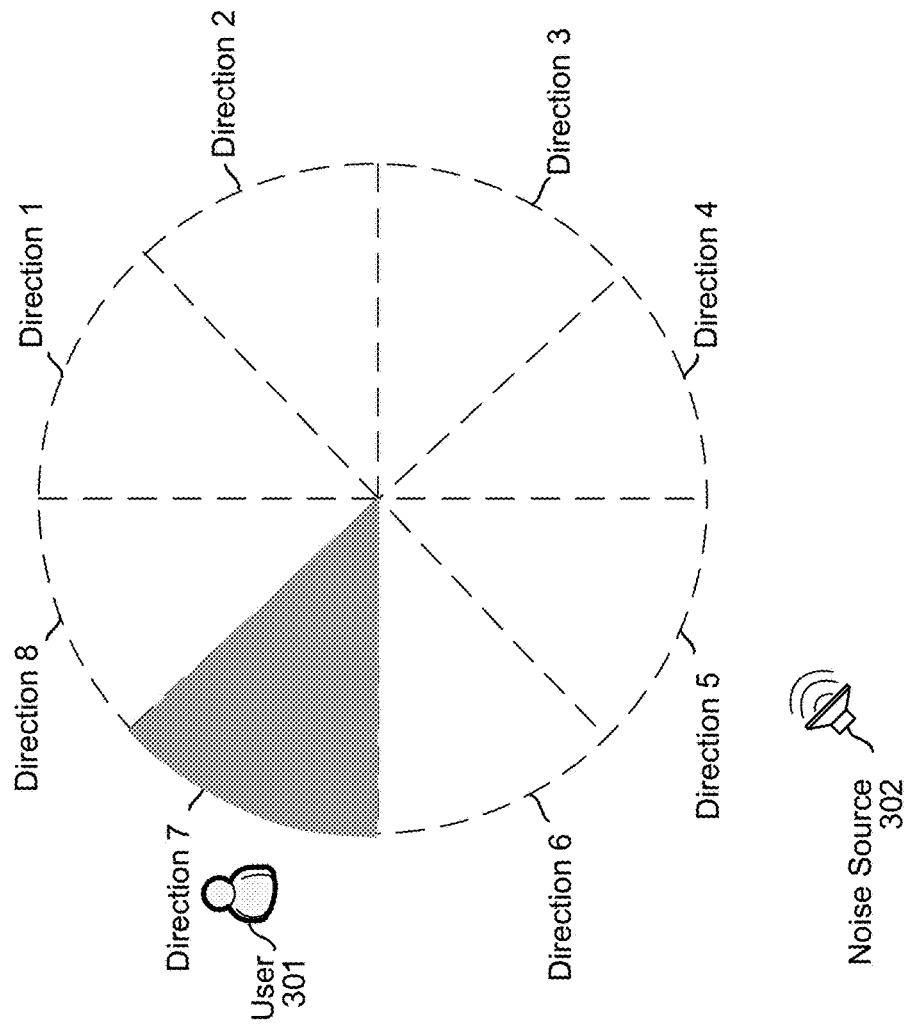

Further details of the device operation are described below following a discussion of directionality in reference to FIGS. 2-3C.

As illustrated in FIG. 2, a device 110 may include, among other components, a microphone array 114, one or more loudspeaker(s) 116, a beamformer unit (as discussed below), or other components. The microphone array may include a number of different individual microphones. In the example configuration of FIG. 2, the microphone array 114 includes eight (8) microphones, 502a-502h. The individual microphones may capture sound and pass the resulting audio signal created by the sound to a downstream component, such as an analysis filterbank discussed below. Each individual piece of audio data captured by a microphone may be in a time domain. To isolate audio from a particular direction, the device may compare the audio data (or audio signals related to the audio data, such as audio signals in a sub-band domain) to determine a time difference of detection of a particular segment of audio data. If the audio data for a first microphone includes the segment of audio data earlier in time than the audio data for a second microphone, then the device may determine that the source of the audio that resulted in the segment of audio data may be located closer to the first microphone than to the second microphone (which resulted in the audio being detected by the first microphone before being detected by the second microphone).

Using such direction isolation techniques, a device 110 may isolate directionality of audio sources. As shown in FIG. 3A, a particular direction may be associated with a particular microphone of a microphone array, where the azimuth angles for the plane of the microphone array may be divided into bins (e.g., 0-45 degrees, 46-90 degrees, and so forth) where each bin direction is associated with a microphone in the microphone array. For example, direction 1 is associated with microphone 502a, direction 2 is associated with microphone 502b, and so on. Alternatively, particular directions and/or beams may not necessarily be associated with a specific microphone.

To isolate audio from a particular direction the device may apply a variety of audio filters to the output of the microphones where certain audio is boosted while other audio is dampened, to create isolated audio corresponding to a particular direction, which may be referred to as a beam. While the number of beams may correspond to the number of microphones, this need not be the case. For example, a two-microphone array may be processed to obtain more than two beams, thus using filters and beamforming techniques to isolate audio from more than two directions. Thus, the number of microphones may be more than, less than, or the same as the number of beams. The beamformer unit of the device may have an adaptive beamformer (ABF) unit/fixed beamformer (FBF) unit processing pipeline for each beam, as explained below.

The device may use various techniques to determine the beam corresponding to the look-direction. If audio is detected first by a particular microphone the device 110 may determine that the source of the audio is associated with the direction of the microphone in the array. Other techniques may include determining what microphone detected the audio with a largest amplitude (which in turn may result in a highest strength of the audio signal portion corresponding to the audio). Other techniques (either in the time domain or in the sub-band domain) may also be used such as calculating a signal-to-noise ratio (SNR) for each beam, performing voice activity detection (VAD) on each beam, or the like.

For example, if audio data corresponding to a user's speech is first detected and/or is most strongly detected by microphone 502g, the device may determine that the user is located in a location in direction 7. Using a FBF unit or other such component, the device may isolate audio coming from direction 7 using techniques known to the art and/or explained herein. Thus, as shown in FIG. 3B, the device 110 may boost audio coming from direction 7, thus increasing the amplitude of audio data corresponding to speech from user 301 relative to other audio captured from other directions. In this manner, noise from diffuse sources that is coming from all the other directions will be dampened relative to the desired audio (e.g., speech from user 301) coming from direction 7.

One drawback to the FBF unit approach is that it may not function as well in dampening/canceling noise from a noise source that is not diffuse, but rather coherent and focused from a particular direction. For example, as shown in FIG. 3C, a noise source 302 may be coming from direction 5 but may be sufficiently loud that noise canceling/beamforming techniques using an FBF unit alone may not be sufficient to remove all the undesired audio coming from the noise source 302, thus resulting in an ultimate output audio signal determined by the device 110 that includes some representation of the desired audio resulting from user 301 (e.g., representation of an utterance) but also some representation of the undesired audio resulting from noise source 302 (e.g., representation of playback audio data).

Figure 4:
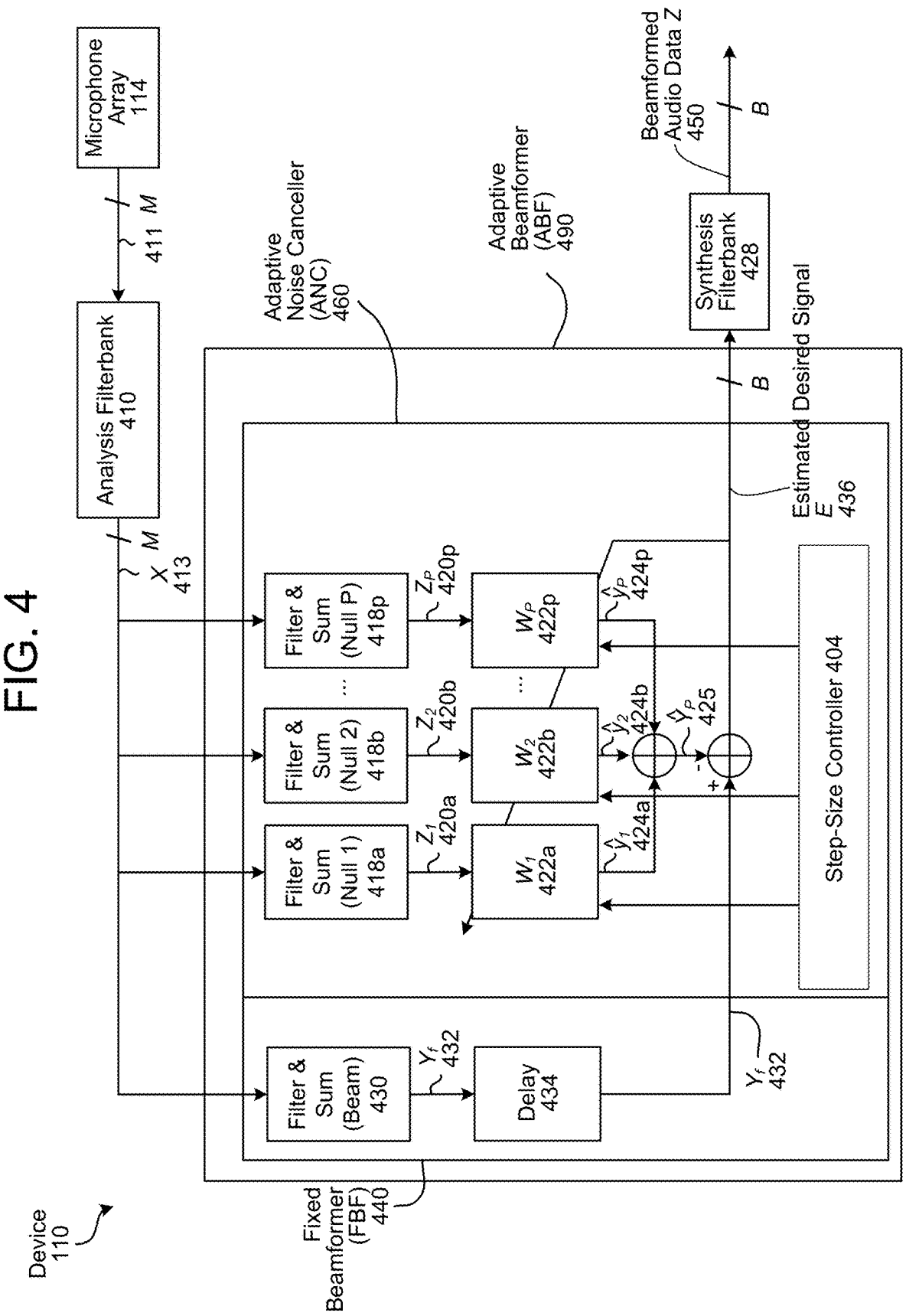
FIG. 4 illustrates a beamforming device that combines a fixed beamformer unit and an adaptive beamformer unit according to embodiments of the present disclosure.

FIG. 4 illustrates a high-level conceptual block diagram of a device 110 configured to performing beamforming using a fixed beamformer unit and an adaptive noise canceller that can remove noise from particular directions using adaptively controlled coefficients which can adjust how much noise is cancelled from particular directions. The FBF unit 440 may be a separate component or may be included in another component such as an adaptive beamformer (ABF) unit 490. As explained below, the FBF unit may operate a filter and sum component 430 to isolate the first audio signal from the direction of an audio source.

The device 110 may also operate an adaptive noise canceller (ANC) unit 460 to amplify audio signals from directions other than the direction of an audio source. Those audio signals represent noise signals so the resulting amplified audio signals from the ABF unit may be referred to as noise reference signals 420, discussed further below. The device 110 may then weight the noise reference signals, for example using filters 422 discussed below. The device may combine the weighted noise reference signals 424 into a combined (weighted) noise reference signal 425. Alternatively the device may not weight the noise reference signals and may simply combine them into the combined noise reference signal 425 without weighting. The device may then subtract the combined noise reference signal 425 from the amplified first audio signal 432 to obtain a difference 436. The device may then output that difference, which represents the desired output audio signal with the noise removed. The diffuse noise is removed by the FBF unit when determining the signal 432 and the directional noise is removed when the combined noise reference signal 425 is subtracted. The device may also use the difference to create updated weights (for example for filters 422) to create updated weights that may be used to weight future audio signals. The step-size controller 404 may be used modulate the rate of adaptation from one weight to an updated weight.

In this manner noise reference signals are used to adaptively estimate the noise contained in the output signal of the FBF unit using the noise-estimation filters 422. This noise estimate is then subtracted from the FBF unit output signal to obtain the final ABF unit output signal. The ABF unit output signal is also used to adaptively update the coefficients of the noise-estimation filters. Lastly, we make use of a robust step-size controller to control the rate of adaptation of the noise estimation filters.

As shown in FIG. 4, input audio data 411 captured by a microphone array may be input into an analysis filterbank 410. The filterbank 410 may include a uniform discrete Fourier transform (DFT) filterbank which converts input audio data 411 in the time domain into an microphone outputs 800 in the sub-band domain. The audio signal X may incorporate audio signals corresponding to multiple different microphones as well as different sub-bands (i.e., frequency ranges) as well as different frame indices (i.e., time ranges). Thus the audio signal from the mth microphone may be represented as $X_m(k,n)$, where k denotes the sub-band index and n denotes the frame index. The combination of all audio signals for all microphones for a particular sub-band index frame index may be represented as X(k,n).

Figure 5:
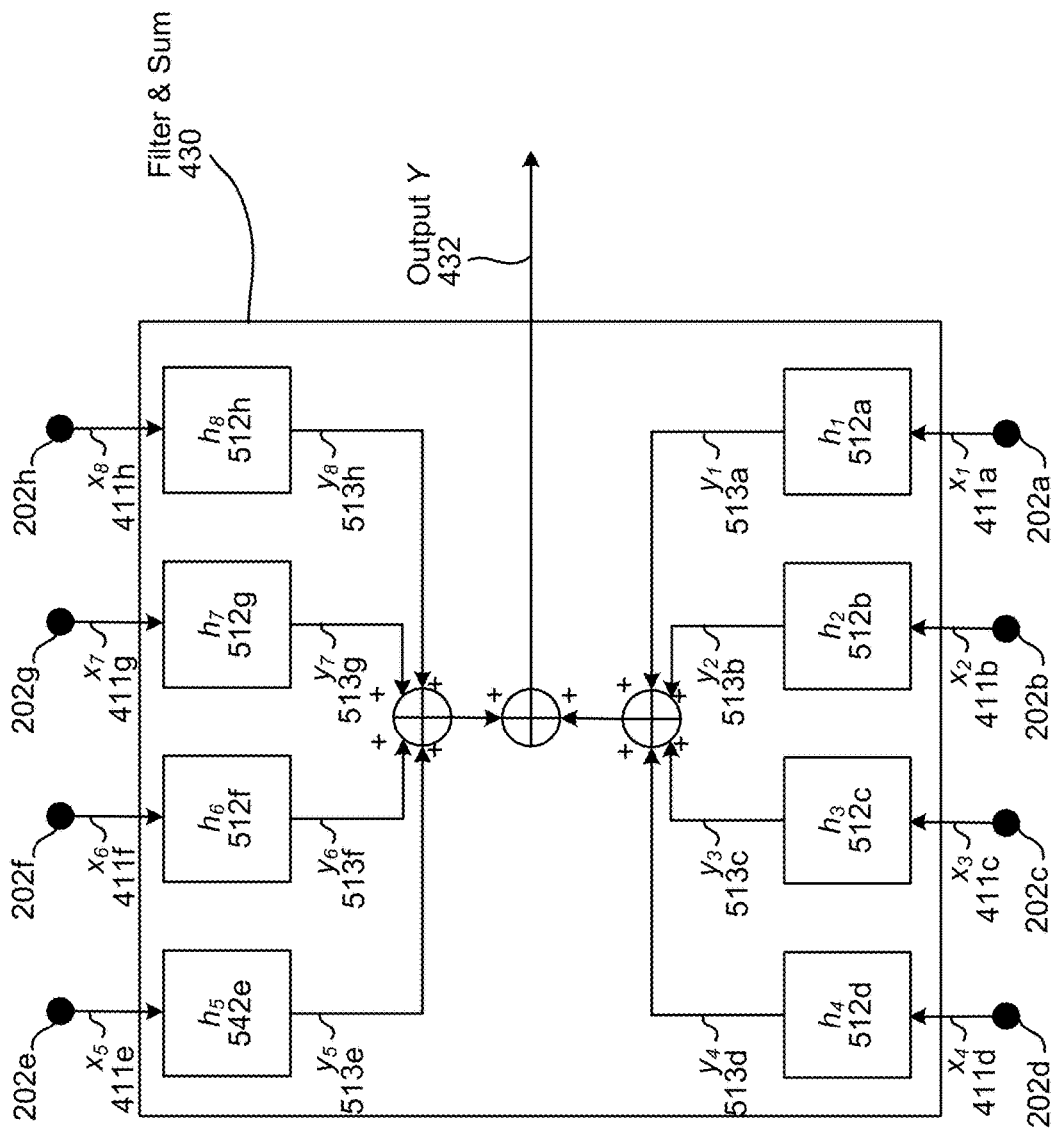
FIG. 5 illustrates a filter and sum component according to embodiments of the present disclosure.

The microphone outputs 800 may be passed to the FBF unit 440 including the filter and sum unit 430. The FBF unit 440 may be implemented as a robust super-directive beamformer unit, delayed sum beamformer unit, or the like. The FBF unit 440 is presently illustrated as a super-directive beamformer (SDBF) unit due to its improved directivity properties. The filter and sum unit 430 takes the audio signals from each of the microphones and boosts the audio signal from the microphone associated with the desired look direction and attenuates signals arriving from other microphones/directions. The filter and sum unit 430 may operate as illustrated in FIG. 5. As shown in FIG. 5, the filter and sum unit 430 may be configured to match the number of microphones of the microphone array. For example, for a microphone array with eight microphones, the filter and sum unit may have eight filter blocks 512. The input audio signals $x_1$ 411a through $x_8$ 411h for each microphone (e.g., microphones 1 through 8) are received by the filter and sum unit 430. The audio signals $x_1$ 411a through $x_8$ 411h correspond to individual microphones 502a through 502h, for example audio signal $x_1$ 411a corresponds to microphone 502a, audio signal $x_2$ 411b corresponds to microphone 502b and so forth. Although shown as originating at the microphones, the audio signals $x_1$ 411a through $x_8$ 411h may be in the sub-band domain and thus may actually be output by the analysis filterbank before arriving at the filter and sum component 430. Each filter block 512 is also associated with a particular microphone. Each filter block is configured to either boost (e.g., increase) or dampen (e.g., decrease) its respective incoming audio signal by the respective beamformer filter coefficient h depending on the configuration of the FBF unit. Each resulting filtered audio signal y 513 will be the audio signal x 411 weighted by the beamformer filter coefficient h of the filter block 512. For example, $y_1=x_1*h_1$, $y_2=x_2*h_2$, and so forth. The filter coefficients are configured for a particular FBF unit associated with a particular beam.

As illustrated in FIG. 6, the adaptive beamformer (ABF) unit 490 configuration (including the FBF unit 440 and the ANC unit 460) illustrated in FIG. 4, may be implemented multiple times in a single device 110. The number of adaptive beamformer (ABF) unit 490 blocks may correspond to the number of beams B. For example, if there are eight beams, there may be eight FBF units 440 and eight ANC units 460. Each adaptive beamformer (ABF) unit 490 may operate as described in reference to FIG. 4, with an individual output E 436 for each beam created by the respective adaptive beamformer (ABF) unit 490. Thus, B different outputs 436 may result. For device configuration purposes, there may also be B different other components, such as the synthesis filterbank 428, but that may depend on device configuration. Each individual adaptive beamformer (ABF) unit 490 may result in its own beamformed audio data Z 450, such that there may be B different beamformed audio data portions Z 450. Each beam's respective beamformed audio data Z 450 may be in a format corresponding to an input audio data 411 or in an alternate format. For example, the input audio data 411 and/or the beamformed audio data Z 450 may be sampled at a rate corresponding to 16 kHz and a mono-channel at 16 bits per sample, little endian format. Audio data in little endian format corresponds to storing the least significant byte of the audio data in the smallest address, as opposed to big endian format where the most significant byte of the audio data is stored in the smallest address.

Each particular FBF unit may be tuned with filter coefficients to boost audio from one of the particular beams. For example, FBF unit 440-1 may be tuned to boost audio from beam 1, FBF unit 440-2 may be tuned to boost audio from beam 2 and so forth. If the filter block is associated with the particular beam, its beamformer filter coefficient h will be high whereas if the filter block is associated with a different beam, its beamformer filter coefficient h will be lower. For example, for FBF unit 440-7, direction 7, the beamformer filter coefficient $h_7$ for filter 512g may be high while beamformer filter coefficients $h_1$-$h_6$ and $h_8$ may be lower. Thus the filtered audio signal $y_7$ will be comparatively stronger than the filtered audio signals $y_1$-$y_6$ and $y_8$ thus boosting audio from direction 7 relative to the other directions. The filtered audio signals will then be summed together to create the output audio signal The filtered audio signals will then be summed together to create the output audio signal $Y_f$ 432. Thus, the FBF unit 440 may phase align microphone audio data toward a give n direction and add it up. So signals that are arriving from a particular direction are reinforced, but signals that are not arriving from the look direction are suppressed. The robust FBF coefficients are designed by solving a constrained convex optimization problem and by specifically taking into account the gain and phase mismatch on the microphones.

The individual beamformer filter coefficients may be represented as $H_{BF,m}(r)$, where r=0, ... R, where R denotes the number of beamformer filter coefficients in the subband domain. Thus, the output $Y_f$ 432 of the filter and sum unit 430 may be represented as the summation of each microphone signal filtered by its beamformer coefficient and summed up across the M microphones:

$$Y(k, n) = \sum_{m=1}^{M} \sum_{r=0}^{R} H_{BF,m}(r) X_m(k, n - r) \tag{1}$$

Turning once again to FIG. 4, the output $Y_f$ 432, expressed in Equation 1, may be fed into a delay component 434, which delays the forwarding of the output Y until further adaptive noise canceling functions as described below may be performed. One drawback to output $Y_f$ 432, however, is that it may include residual directional noise that was not canceled by the FBF unit 440. To remove that directional noise, the device 110 may operate an adaptive noise canceller (ANC) unit 460 which includes components to obtain the remaining noise reference signal which may be used to remove the remaining noise from output Y.

As shown in FIG. 4, the adaptive noise canceller may include a number of nullformer blocks 418a through 418p. The device 110 may include P number of nullformer blocks 418 where P corresponds to the number of channels, where each channel corresponds to a direction in which the device may focus the nullformers 418 to isolate detected noise. The number of channels P is configurable and may be predetermined for a particular device 110. Each nullformer block is configured to operate similarly to the filter and sum block 430, only instead of the filter coefficients for the nullformer blocks being selected to boost the look ahead direction, they are selected to boost one of the other, non-look ahead directions. Thus, for example, nullformer 418a is configured to boost audio from direction 1, nullformer 418b is configured to boost audio from direction 2, and so forth. Thus, the nullformer may actually dampen the desired audio (e.g., speech) while boosting and isolating undesired audio (e.g., noise). For example, nullformer 418a may be configured (e.g., using a high filter coefficient $h_1$ 512a) to boost the signal from microphone 502a/direction 1, regardless of the look ahead direction. Nullformers 418b through 418p may operate in similar fashion relative to their respective microphones/directions, though the individual coefficients for a particular channel's nullformer in one beam pipeline may differ from the individual coefficients from a nullformer for the same channel in a different beam's pipeline. The output Z 420 of each nullformer 418 will be a boosted signal corresponding to a non-desired direction. As audio from non-desired direction may include noise, each signal Z 420 may be referred to as a noise reference signal. Thus, for each channel 1 through P the adaptive noise canceller (ANC) unit 460 calculates a noise reference signal Z 420, namely $Z_1$ 420a through $Z_P$ 420p. Thus, the noise reference signals that are acquired by spatially focusing towards the various noise sources in the environment and away from the desired look-direction. The noise reference signal for channel p may thus be represented as $Z_p(k,n)$ where $Z_P$ is calculated as follows:

$$Z_p(k, n) = \sum_{m=1}^{M}\sum_{r=0}^{R}H_{NF,m}(p, r)X_m(k, n - r) \qquad (2)$$

where $H_{NF,m}(p,r)$ represents the nullformer coefficients for reference channel p.

As described above, the coefficients for the nullformer filters 512 are designed to form a spatial null toward the look ahead direction while focusing on other directions, such as directions of dominant noise sources (e.g., noise source 302). The output from the individual nullformers $Z_1$ 420a through $Z_P$ 420p thus represent the noise from channels 1 through P.

The individual noise reference signals may then be filtered by noise estimation filter blocks 422 configured with weights W to adjust how much each individual channel's noise reference signal should be weighted in the eventual combined noise reference signal $\hat{Y}$ 425. The noise estimation filters (further discussed below) are selected to isolate the noise to be removed from output $Y_f$ 432. The individual channel's weighted noise reference signal $\hat{y}$ 424 is thus the channel's noise reference signal Z multiplied by the channel's weight W. For example, $\hat{y}_1=Z_1*W_1$, $\hat{y}_2=Z_2*W_2$, and so forth. Thus, the combined weighted noise estimate $\hat{Y}$ 425 may be represented as:

$$\hat{Y}_p(k,n)=\Sigma_{l=0}^{L}W_p(k,n,l)Z_p(k,n-l) \qquad (3)$$

where $W_p(k,n,l)$ is the lth element of $W_p(k,n)$ and l denotes the index for the filter coefficient in subband domain. The noise estimates of the P reference channels are then added to obtain the overall noise estimate:

$$\hat{Y}(k, n) = \sum_{p=1}^{P}\hat{Y}_p(k, n) \qquad (4)$$

The combined weighted noise reference signal $\hat{Y}$ 425, which represents the estimated noise in the audio signal, may then be subtracted from the FBF unit output $Y_f$ 432 to obtain a signal E 436, which represents the error between the combined weighted noise reference signal $\hat{Y}$ 425 and the FBF unit output $Y_f$ 432. That error, E 436, is thus the estimated desired non-noise portion (e.g., target signal portion) of the audio signal and may be the output of the adaptive noise canceller (ANC) unit 460. That error, E 436, may be represented as:

$$E(k,n)=Y(k,n)-\hat{Y}(k,n) \qquad (5)$$

As shown in FIG. 4, the ABF unit output signal 436 may also be used to update the weights W of the noise estimation filter blocks 422 using sub-band adaptive filters, such as with a normalized least mean square (NLMS) approach:

$$W_p(k, n) = W_p(k, n - 1) + \frac{\mu_p(k, n)}{\|Z_p(k, n)\|^2 + \varepsilon}Z_p(k, n)E(k, n) \qquad (6)$$

where $Z_p(k,n)=[Z_p(k,n)\ Z_p(k,n-1)\ \ldots\ Z(k,n-L)]^T$ is the noise estimation vector for the pth channel, $\mu_p(k,n)$ is the adaptation step-size for the pth channel, and $\varepsilon$ is a regularization factor to avoid indeterministic division. The weights may correspond to how much noise is coming from a particular direction.

As can be seen in Equation 6, the updating of the weights W involves feedback. The weights W are recursively updated by the weight correction term (the second half of the right hand side of Equation 6) which depends on the adaptation step size, $\mu_p(k,n)$, which is a weighting factor adjustment to be added to the previous weighting factor for the filter to obtain the next weighting factor for the filter (to be applied to the next incoming signal). To ensure that the weights are updated robustly (to avoid, for example, target signal cancellation) the step size $\mu_p(k,n)$ may be modulated according to signal conditions. For example, when the desired signal arrives from the look-direction, the step-size is significantly reduced, thereby slowing down the adaptation process and avoiding unnecessary changes of the weights W. Likewise, when there is no signal activity in the look-direction, the step-size may be increased to achieve a larger value so that weight adaptation continues normally. The step-size may be greater than 0, and may be limited to a maximum value. Thus, the device may be configured to determine when there is an active source (e.g., a speaking user) in the look-direction. The device may perform this determination with a frequency that depends on the adaptation step size.

The step-size controller 404 will modulate the rate of adaptation. Although not shown in FIG. 4, the step-size controller 404 may receive various inputs to control the step size and rate of adaptation including the noise reference signals 420, the FBF unit output $Y_f$ 432, the previous step size, the nominal step size (described below) and other data. The step-size controller may calculate Equations 6-13 below. In particular, the step-size controller 404 may compute the adaptation step-size for each channel p, sub-band k, and frame n. To make the measurement of whether there is an active source in the look-direction, the device may measure a ratio of the energy content of the beam in the look direction (e.g., the look direction signal in output $Y_f$ 432) to the ratio of the energy content of the beams in the non-look directions (e.g., the non-look direction signals of noise reference signals $Z_1$ 420a through $Z_P$ 420p). This may be referred to as a beam-to-null ratio (BNR). For each subband, the device may measure the BNR. If the BNR is large, then an active source may be found in the look direction, if not, an active source may not be in the look direction.

The BNR may be computed as:

$$BNR_p(k, n) = \frac{B_{YY}(k, n)}{N_{ZZ,p}(k, n) + \delta}, \quad (7)$$

$$k \in [k_{LB}, k_{UB}]$$

where, $k_{LB}$ denotes the lower bound for the subband range bin and $k_{UB}$ denotes the upper bound for the subband range bin under consideration, and $\delta$ is a regularization factor. Further, $B_{YY}(k\ n)$ denotes the powers of the fixed beamformer output signal (e.g., output $Y_f$ 432) and $N_{ZZ,p}(k,n)$ denotes the powers of the pth nullformer output signals (e.g., the noise reference signals $Z_1$ 420a through $Z_P$ 420p). The powers may be calculated using first order recursive averaging as shown below:

$$B_{YY}(k,n) = \alpha B_{YY}(k,n-1) + (1-\alpha)|Y(k,n)|^2$$

$$N_{ZZ,p}(k,n) = \alpha N_{ZZ,p}(k,n-1) + (1-\alpha)|Z_p(k,n)|^2 \quad (8)$$

where, $\alpha \in [0,1]$ is a smoothing parameter.

The BNR values may be limited to a minimum and maximum value as follows:

$$BNR_p(k,n) \in [BNR_{min}, BNR_{max}]$$

the BNR may be averaged across the subband bins:

$$BNR_p(n) = \frac{1}{(k_{UB} - k_{LB} + 1)} \sum_{k_{LB}}^{k_{UB}} BNR_p(k, n) \quad (9)$$

the above value may be smoothed recursively to arrive at the mean BNR value:

$$\overline{BNR}_p(n) = \beta \overline{BNR}_p(n-1) + (1-\beta) BNR_p(n) \quad (10)$$

where $\beta$ is a smoothing factor.

The mean BNR value may then be transformed into a scaling factor in the interval of [0,1] using a sigmoid transformation:

$$\xi(n) = 1 - 0.5\left(1 + \frac{v(n)}{1 + |v(n)|}\right) \quad (11)$$

where $$v(n) = \gamma(\overline{BNR}_p(n) - \sigma) \quad (12)$$

and $\gamma$ and $\sigma$ are tunable parameters that denote the slope ($\gamma$) and point of inflection ($\sigma$), for the sigmoid function.

Using Equation 11, the adaptation step-size for subband k and frame-index n is obtained as:

$$\mu_p(k, n) = \xi(n)\left(\frac{N_{ZZ,p}(k, n)}{B_{YY}(k, n) + \delta}\right)\mu_o \quad (13)$$

where $\mu_o$ is a nominal step-size. $\mu_o$ may be used as an initial step size with scaling factors and the processes above used to modulate the step size during processing.

At a first time period, audio signals from the microphone array 114 may be processed as described above using a first set of weights for the filters 422. Then, the error E 436 associated with that first time period may be used to calculate a new set of weights for the filters 422, where the new set of weights is determined using the step size calculations described above. The new set of weights may then be used to process audio signals from a microphone array 114 associated with a second time period that occurs after the first time period. Thus, for example, a first filter weight may be applied to a noise reference signal associated with a first audio signal for a first microphone/first direction from the first time period. A new first filter weight may then be calculated using the method above and the new first filter weight may then be applied to a noise reference signal associated with the first audio signal for the first microphone/first direction from the second time period. The same process may be applied to other filter weights and other audio signals from other microphones/directions.

The above processes and calculations may be performed across sub-bands k, across channels p and for audio frames n, as illustrated in the particular calculations and equations.

The estimated non-noise (e.g., output) audio signal E 436 may be processed by a synthesis filterbank 428 which converts the signal 436 into time-domain beamformed audio data Z 450 which may be sent to a downstream component for further operation. As illustrated in FIG. 6, there may be one component audio signal E 436 for each beam, thus for B beams there may be B audio signals E 436. Similarly, there may be one stream of beamformed audio data Z 450 for each beam, thus for B beams there may be B beamformed audio signals B 450. For example, a first beamformed audio signal may correspond to a first beam and to a first direction, a second beamformed audio signal may correspond to a second beam and to a second direction, and so forth.

As shown in FIGS. 4 and 6, the input audio data from a microphone array may include audio data 411 for each microphone 0 through M in the time domain, which may be converted by the analysis filterbank into spectral domain audio signals X 413 for each microphone 0 through M. The beamformer unit may then convert the audio signals X 413 into beamformer output signals E 436 in the spectral domain, with one signal for each beam 0 through B. The synthesis filterbank may then may convert the signals E 436 into time domain beamformer audio data Z 450, with one set of audio data Z 450 for each beam 0 through B.

Figure 7B:
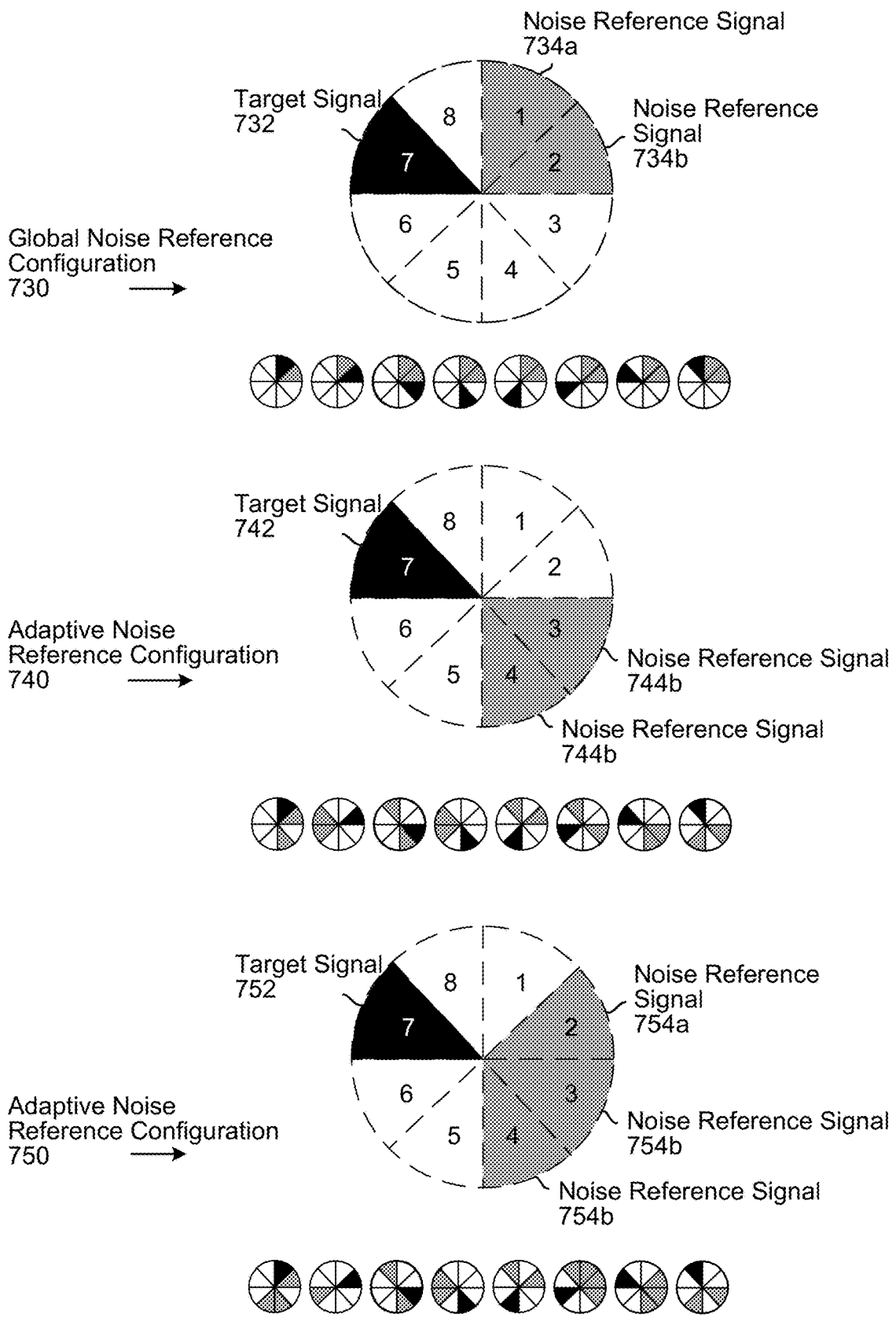

FIGS. 7A-7B illustrate examples of noise reference signals according to embodiments of the present disclosure. The device 110 may determine the noise reference signal(s)

using a variety of techniques. In some examples, the device 110 may use the same noise reference signal(s) for each of the directional outputs. For example, the device 110 may select a first directional output associated with a particular direction as a noise reference signal and may determine the signal quality metric for each of the directional outputs by dividing a power value associated with an individual directional output by a power value associated with the first directional output (e.g., noise power level). Thus, the device 110 may determine a first signal quality metric by dividing a first power level associated with a second directional output by the noise power level, may determine a second signal quality metric by dividing a second power level associated with a third directional output by the noise power level, and so on. As the noise reference signal is the same for each of the directional outputs, instead of determining a ratio the device 110 may use the power level associated with each of the directional outputs as the signal quality metrics.

In some examples, each directional output may be associated with unique noise reference signal(s). To illustrate an example, the device 110 may determine the noise reference signal(s) using a fixed configuration based on the directional output. For example, the device 110 may select a first directional output (e.g., Direction 1) and may choose a second directional output (e.g., Direction 5, opposite Direction 1 when there are eight beams corresponding to eight different directions) as a first noise reference signal for the first directional output, may select a third directional output (e.g., Direction 2) and may choose a fourth directional output (e.g., Direction 6) as a second noise reference signal for the third directional output, and so on. This is illustrated in FIG. 7A as a single fixed noise reference configuration 710.

As illustrated in FIG. 7A, in the single fixed noise reference configuration 710, the device 110 may select a seventh directional output (e.g., Direction 7) as a target signal 712 and select a third directional output (e.g., Direction 3) as a noise reference signal 714. The device 110 may continue this pattern for each of the directional outputs, using Direction 1 as a target signal and Direction 5 as a noise reference signal, Direction 2 as a target signal and Direction 6 as a noise reference signal, Direction 3 as a target signal and Direction 7 as a noise reference signal, Direction 4 as a target signal and Direction 8 as a noise reference signal, Direction 5 as a target signal and Direction 1 as a noise reference signal, Direction 6 as a target signal and Direction 2 as a noise reference signal, Direction 7 as a target signal and Direction 3 as a noise reference signal, and Direction 8 as a target signal and Direction 4 as a noise reference signal.

As an alternative, the device 110 may use a double fixed noise reference configuration 720. For example, the device 110 may select the seventh directional output (e.g., Direction 7) as a target signal 722 and may select a second directional output (e.g., Direction 2) as a first noise reference signal 724a and a fourth directional output (e.g., Direction 4) as a second noise reference signal 724b. The device 110 may continue this pattern for each of the directional outputs, using Direction 1 as a target signal and Directions 4/6 as noise reference signals, Direction 2 as a target signal and Directions 5/7 as noise reference signals, Direction 3 as a target signal and Directions 6/8 as noise reference signals, Direction 4 as a target signal and Directions 7/9 as noise reference signal, Direction 5 as a target signal and Directions 8/2 as noise reference signals, Direction 6 as a target signal and Directions 1/3 as noise reference signals, Direction 7 as a target signal and Directions 2/4 as noise reference signals, and Direction 8 as a target signal and Directions 3/5 as noise reference signals.

While FIG. 7A illustrates using a fixed configuration to determine noise reference signal(s), the disclosure is not limited thereto. FIG. 7B illustrates examples of the device 110 selecting noise reference signal(s) differently for each target signal. As a first example, the device 110 may use a global noise reference configuration 730. For example, the device 110 may select the seventh directional output (e.g., Direction 7) as a target signal 732 and may select the first directional output (e.g., Direction 1) as a first noise reference signal 734a and the second directional output (e.g., Direction 2) as a second noise reference signal 734b. The device 110 may use the first noise reference signal 734a and the second noise reference signal 734b for each of the directional outputs (e.g., Directions 1-8).

As a second example, the device 110 may use an adaptive noise reference configuration 740, which selects two directional outputs as noise reference signals for each target signal. For example, the device 110 may select the seventh directional output (e.g., Direction 7) as a target signal 742 and may select the third directional output (e.g., Direction 3) as a first noise reference signal 744a and the fourth directional output (e.g., Direction 4) as a second noise reference signal 744b. However, the noise reference signals may vary for each of the target signals, as illustrated in FIG. 7B.

As a third example, the device 110 may use an adaptive noise reference configuration 750, which selects one or more directional outputs as noise reference signals for each target signal. For example, the device 110 may select the seventh directional output (e.g., Direction 7) as a target signal 752 and may select the second directional output (e.g., Direction 2) as a first noise reference signal 754a, the third directional output (e.g., Direction 3) as a second noise reference signal 754b, and the fourth directional output (e.g., Direction 4) as a third noise reference signal 754c. However, the noise reference signals may vary for each of the target signals, as illustrated in FIG. 7B, with a number of noise reference signals varying between one (e.g., Direction 6 as a noise reference signal for Direction 2) and four (e.g., Directions 1-3 and 8 as noise reference signals for Direction 6).

In some examples, the device 110 may determine a number of noise references based on a number of dominant audio sources. For example, if someone is talking while music is playing over loudspeakers and a blender is active, the device 110 may detect three dominant audio sources (e.g., talker, loudspeaker, and blender) and may select one dominant audio source as a target signal and two dominant audio sources as noise reference signals. Thus, the device 110 may select first audio data corresponding to the person speaking as a first target signal and select second audio data corresponding to the loudspeaker and third audio data corresponding to the blender as first reference signals. Similarly, the device 110 may select the second audio data as a second target signal and the first audio data and the third audio data as second reference signals, and may select the third audio data as a third target signal and the first audio data and the second audio data as third reference signals.

Additionally or alternatively, the device 110 may track the noise reference signal(s) over time. For example, if the music is playing over a portable loudspeaker that moves around the room, the device 110 may associate the portable loudspeaker with a noise reference signal and may select different portions of the beamformed audio data based on a location of the portable loudspeaker. Thus, while the direction associated with the portable loudspeaker changes over time, the device 110 selects beamformed audio data corresponding to a current direction as the noise reference signal.

While some of the examples described above refer to determining instantaneous values for a signal quality metric (e.g., a signal-to-interference ratio (SIR), a signal-to-noise ratio (SNR), or the like), the disclosure is not limited thereto. Instead, the device 110 may determine the instantaneous values and use the instantaneous values to determine average values for the signal quality metric. Thus, the device 110 may use average values or other calculations that do not vary drastically over a short period of time in order to select which signals on which to perform additional processing. For example, a first audio signal associated with an audio source (e.g., person speaking, loudspeaker, etc.) may be associated with consistently strong signal quality metrics (e.g., high SIR/SNR) and intermittent weak signal quality metrics. The device 110 may average the strong signal metrics and the weak signal quality metrics and continue to track the audio source even when the signal quality metrics are weak without departing from the disclosure.

As discussed above, electronic devices may perform acoustic echo cancellation and/or adaptive interference cancellation to remove and/or attenuate an echo signal captured in the input audio data. For example, the device 110 may receive playback audio data and may generate output audio corresponding to the playback audio data using the one or more loudspeaker(s) 116. While generating the output audio, the device 110 may capture input audio data using the microphone array 114. In addition to capturing speech (e.g., the input audio data includes a representation of speech), the device 110 may capture a portion of the output audio generated by the loudspeaker(s) 116, which may be referred to as an "echo" or echo signal. Due to the presence of the echo signal, the device 110 may be unable to accurately detect whether speech is present in the input audio data.

In order to improve adaptive interference cancellation, the device 110 may use a cascaded adaptive interference cancellation system that consists of two stages. In a first stage, the device 110 may perform adaptive interference cancellation to remove at least a portion of the echo signal from the input audio data and generate isolated input audio data. To increase an accuracy of detecting speech, the device 110 may determine whether speech is detected within the isolated input audio data instead of within the input audio data. For example, the device 110 may generate speech mask data indicating whether speech is detected in the isolated audio data. After determining whether speech is present in the isolated input audio data, the device 110 may perform a second stage of adaptive interference cancellation to generate output audio data based on the speech mask data. For example, the device 110 may perform the second stage of AIC using an adaptive filter that adapts filter coefficient values when speech is not present (e.g., to remove more of the echo signal and therefore minimize an error signal) and freezes adaptation of the filter coefficient values when speech is present (e.g., to prevent the adaptive filter from removing the desired speech from the output audio data).

Figure 8C:
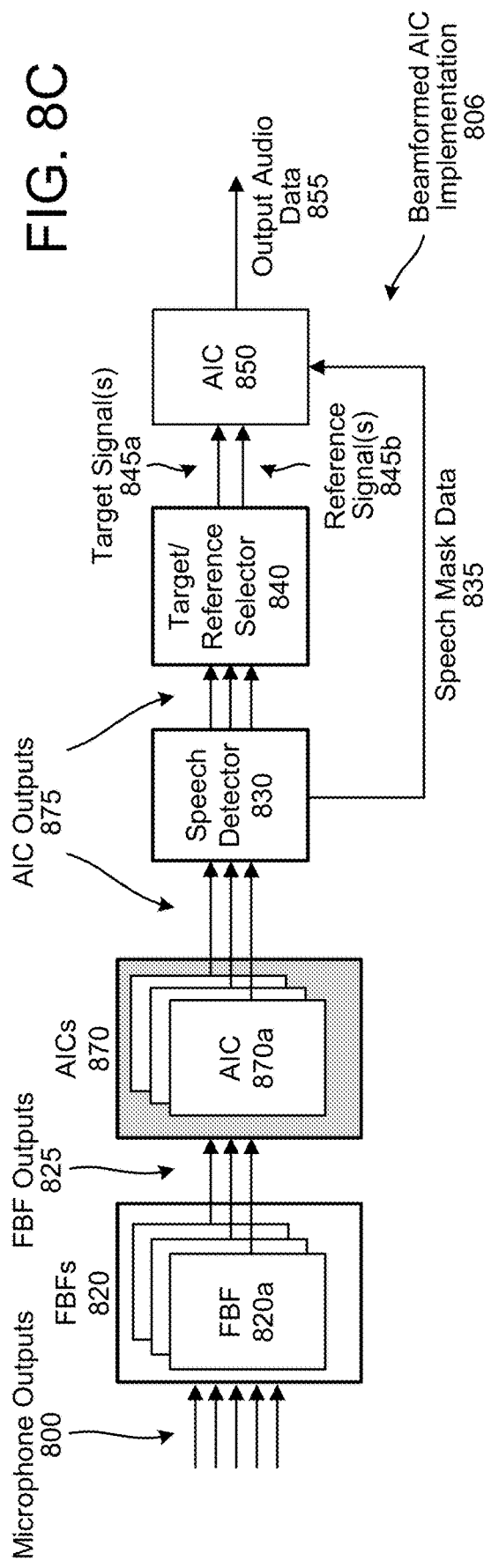

FIGS. 8A-8E illustrate examples of cascaded adaptive interference cancellation systems according to embodiments of the present disclosure. For example, FIG. 8A illustrates a first example (e.g., acoustic echo cancellation (AEC) implementation 802) in which the system 100 may perform AEC using playback audio data 805 prior to performing adaptive interference cancellation (AIC) using beamformed audio data. FIG. 8B illustrates a second example (e.g., input AIC implementation 804) in which the system 100 may perform AIC using microphone outputs 800 prior to performing AIC using beamformed audio data. FIG. 8C illustrates a third example (e.g., beamformed AIC implementation 806) in which the system 100 may perform AIC using beamformed audio data twice. FIGS. 8D-8E illustrate a fourth and fifth example (e.g., redundant input AIC implementation 808a-808b) in which the system 100 may perform AIC using microphone outputs 800 twice.

As illustrated in FIG. 8A, the AEC implementation 802 may perform the first stage of acoustic echo cancellation by generating a reference signal based on playback audio data 805. For example, microphone outputs 800 (e.g., input audio data captured by the microphone array 114) is input to one or more acoustic echo cancellation components (AECs) 810 and the AECs generate AEC outputs 815 by canceling an echo signal.

To illustrate an example of canceling the echo signal, playback audio data 805 may be sent to one or more loudspeaker(s) 116 and the loudspeaker(s) 116 may generate output audio based on the playback audio data 805. For example, the playback audio data 805 may correspond to music and the one or more loudspeaker(s) 116 may play the music. The microphone array 114 may capture a portion of the output audio (e.g., capture a portion of the music) and generate the microphone outputs 800, which may include a representation of the output audio as an "echo signal." Therefore, a portion of the microphone outputs 800 may correspond to the output audio or echo signal and may interfere with speech processing or other processing that is used to process an utterance (e.g., speech) captured by the microphone array 114 and included in the microphone outputs 800.

To remove (e.g., cancel) and/or attenuate the echo signal from the microphone outputs 800, the AEC implementation 802 illustrated in FIG. 8A includes AECs 810 that may determine an estimated echo signal based on the playback audio data 805. For example, the device 110 may process the playback audio data 805, synchronize the playback audio data 805 with the microphone outputs 800, apply adaptive filters to the playback audio data 805 to generate the estimated echo signal and remove the estimated echo signal from the microphone outputs 800. Thus, the AEC outputs 815 correspond to the microphone outputs 800 after removing the estimated echo signal.

A number of AEC components included in the AECs 810 may depend on a number of audio channels. In some examples, the device 110 may include an AEC component 810 for each microphone included in the microphone array 114, such that each microphone output 800 is processed by a separate AEC component 810. For example, if the microphone array 114 includes eight microphones, the AECs 810 may include eight AEC components (e.g., 810a-810h). However, the disclosure is not limited thereto and the number of microphones and/or AEC components 810 may vary without departing from the disclosure. Additionally or alternatively, a single AEC component 810 may generate AEC outputs 815 for multiple microphones without departing from the disclosure.

After performing AEC to generate the AEC outputs 815, the AEC outputs 815 may be input to one or more fixed beamformer (FBF) units 820. The fixed beamformer units may isolate audio from a desired direction by boosting audio received from the desired direction while dampening audio received from a non-desired direction. For example, each of the FBF units 820 may include a filter-and-sum structure to boost an audio signal that originates from the desired direction (e.g., look-direction) while largely attenuating audio signals that originate from other directions.

A number of fixed beamformer units included in the FBF units 820 may depend on a desired number of beams. For example, to generate twelve beams, the device 110 may include twelve separate fixed beamformer units (e.g., 820a-820l), with each fixed beamformer unit processing the AEC outputs 815 to generate an individual beam (e.g., directional output, directional audio signal, beamformed audio data, or the like) corresponding to a particular direction. The FBF units 820 may generate FBF unit outputs 825, which correspond to the desired number of beams. Thus, the AEC outputs 815 are separated into a plurality of audio signals, enabling the device 110 to process audio data associated with a particular direction.

As illustrated in FIG. 8A, the number of microphone outputs 800/AEC outputs 815 and the number of FBF outputs 825 may not be the same. For example, FIG. 8A illustrates the microphone outputs 800 and the AEC outputs 815 using five arrows, whereas the FBF outputs 825 are illustrated using only three arrows. However, this is intended for illustrative purposes only, and the number of audio channels included in the microphone outputs 800 and/or the number of beams are typically factors of 2 (e.g., 2, 4, 6, 8, 12, etc.), although the disclosure is not limited thereto. For example, the microphone array 114 may include eight microphones whereas the device 110 may generate twelve beams. Additionally or alternatively, the number of audio channels included in the microphone outputs 800 and the number of beams included in the FBF outputs 825 may be the same without departing from the disclosure.

The FBF outputs 825 are input to a speech detector 830 that is configured to detect speech and generate speech mask data 835. For example, the speech detector 830 may determine whether speech is detected in any of the beams included in the FBF outputs 825. If the speech detector 830 determines that speech is detected in any of the FBF outputs 825, the speech detector 830 may set a corresponding value in the speech mask data 835 (e.g., first value in the speech mask data) equal to a first binary value (e.g., value of logic high or one). If the speech detector 830 determines that speech is not detected in any of the FBF outputs 825, the speech detector 830 may set a corresponding value in the speech mask data 835 equal to a second binary value (e.g., value of logic low or zero). Thus, the speech mask data 835 may indicate whether speech is detected in at least one of the FBF outputs 825 for a particular time window within the FBF outputs 825. However, the disclosure is not limited thereto, and the speech detector 830 may generate the speech mask data 835 using any technique known to one of skill in the art and/or may indicate that speech is detected using the second binary value without departing from the disclosure.

The FBF outputs 825 may be input to a target/reference selector 840 that is configured to select target signal(s) 845a and reference signal(s) 845b. For example, the target/reference selector 840 may determine a signal quality metric value for each of the FBF outputs 825, may select one or more target signal(s) 845a having highest signal quality metric values, and may select one or more reference signal(s) 845b having lowest signal quality metric values. Thus, the target signal(s) 845a may include one or more directional outputs that are associated with the desired speech and the reference signal(s) 845b may include one or more directional outputs that are associated with acoustic interference.

To illustrate an example, the FBF outputs 825 may include twelve different directional outputs (e.g., twelve beams) and the target/reference selector 840 may determine twelve different signal quality metric values, one for each of the directional outputs. Examples of a signal quality metric may include a signal-to-noise ratio (SNR) value, an echo-return loss enhancement (ERLE) value, and/or the like, although the disclosure is not limited thereto. In some examples, the target/reference selector 840 may select a single target signal 845a having a highest signal quality metric value (e.g., highest SNR value) and a single reference signal 845b having a lowest signal quality metric value (e.g., lowest SNR value). In other examples, the target/reference selector 840 may select two or more target signals 845a having highest signal quality metric values and/or may select two or more reference signals 845b having lowest signal quality metric values, although the disclosure is not limited thereto.

While the examples illustrated above refer to the target/reference selector 840 selecting the target signal(s) 845a and the reference signal(s) 845b based on the highest/lowest signal quality metric values, the disclosure is not limited thereto and the target/reference selector 840 may select the target signal(s) 845a and/or the reference signal(s) 845b using any technique known to one of skill in the art. Thus, in some examples, the target signal(s) 845a may omit a directional output associated with a high signal quality metric and/or include a directional output associated with an average signal quality metric without departing from the disclosure. Similarly, in some examples, the reference signal(s) 845b may omit a directional output associated with a low signal quality metric and/or include a directional output associated with an average signal quality metric without departing from the disclosure. Additionally or alternatively, the target/reference selector 840 may include a deep neural network (DNN) (e.g., a first model) or other component that is configured to select the target signal(s) 845a and the reference signal(s) 845b without departing from the disclosure.

In a second stage of adaptive interference cancellation, the target signal(s) 845a and the reference signal(s) 845b are input to an adaptive interference cancellation (AIC) component 850. For example, the AIC component 850 may perform adaptive interference cancellation on the FBF outputs 825, using a first portion of the FBF outputs 825 as the target signal(s) 845a and a second portion of the FBF outputs 825 as the reference signal(s) 845b. Thus, the AIC component 850 may remove the reference signal(s) 845b from the target signal(s) 845a to generate output audio data 855.

The AIC component 850 may include an adaptive filter and may use the speech mask data 835 to control the adaptive filter. For example, as part of removing the reference signal(s) 845b from the target signal(s) 845a, the AIC component 850 may adapt filter coefficient values of the adaptive filter to minimize an error signal (e.g., difference between the target signal(s) 845a and the reference signal(s) 845b). Thus, the adaptive filter assumes that the error signal corresponds to unwanted noise and adapts the filter coefficient values in an attempt to remove a larger portion of the reference signal(s) 845b.

When speech is present in the target signal(s) 845a, however, the assumption that the error signal corresponds to unwanted noise is invalid. For example, when speech is present in the target signal(s) 845a, the error signal may correspond to desired speech, and any attempts by the AIC component 850 to minimize the error signal results in distortion to the desired speech. To improve the output audio data 855 and reduce distortion, the AIC component 850 may determine that speech is present based on the speech mask data 835 and may freeze adaptation of the filter coefficient values. Thus, the speech mask data 835 is used to control adaptation of the AIC component 850 and reduce distortion of the desired speech in the output audio data 855.

The AIC component 850 may freeze adaptation of the filter coefficient values whenever the speech mask data 835 indicates that speech may be detected, even if the speech is not present in the target signal(s) 845a or actually present in the FBF outputs 825 at all. To illustrate this point, adapting the filter coefficient values when speech is present results in distortion in the output audio data 855, whereas freezing adaptation of the filter coefficient values when speech is not present does not result in distortion in the output audio data 855. Therefore, the device 110 may use a relatively low threshold value to detect speech without negatively impacting the output audio data 855.

As illustrated in FIG. 8A, the AEC implementation 802 performs the first stage of acoustic echo cancellation using playback audio data 805 as a reference signal. In contrast, FIG. 8B illustrates the input AIC implementation 804, which uses the microphone outputs 800 as the reference signal(s).

As illustrated in FIG. 8B, microphone outputs 800 (e.g., input audio data captured by the microphone array 114) are input to one or more adaptive interference cancellation (AIC) components 860 and the AIC components 860 generate AIC outputs 865. For example, a first AIC component 860a may use a first microphone output signal 800a corresponding to a first microphone as a target signal. The first AIC component 860a may estimate a noise reference signal using at least one of the remaining microphone output signals 800 (e.g., microphone output signals not associated with the first microphone, such as a second microphone output signal 800b corresponding to a second microphone) and may remove the noise reference signal from the first microphone output signal 800a. Thus, the output of the first AIC 860a corresponds to audio data associated with the first microphone after noise and/or interference is cancelled from the other microphone(s).

A number of AIC components 860 included in the device 110 may depend on the number of microphones included in the microphone array 114. For example, if there are eight microphones in the microphone array 114, the device 110 may include eight AIC components 860 configured to perform adaptive interference cancelling and generate eight AIC outputs 865. However, the disclosure is not limited thereto and the number of AIC components 865 may vary without departing from the disclosure. For example, a first number of microphones in the microphone array 114 may be associated with a source of noise (e.g., one or more microphones may be placed in proximity to a known source of noise, such as an engine compartment in a vehicle) and the number of AIC components 865 may be equal to a difference between a total number of microphones included in the microphone array 114 and the first number of microphones. In this example, the first number of microphones may be used as a reference signal for the AIC components 865, although the disclosure is not limited thereto. Additionally or alternatively, the device 110 may include several AIC components 860 for a single microphone signal without departing from the disclosure.

The AIC components 860 may select the reference signal(s) using any technique known to one of skill in the art. In some examples, the AIC components 860 may select a fixed reference signal or a fixed group of reference signals to remove from all of the target signals, as described above with regard to the global noise reference configuration 730 illustrated in FIG. 7B. For example, the AIC components 860 may select the second microphone output signal 800b as a reference signal (or microphone output signals 800b-800d as reference signals) to be used by all of the AIC components 860. Thus, if there are eight microphones in the microphone array 114, each of the AIC components 860a-860h may remove the second microphone output signal 800b from a corresponding target signal (e.g., microphone output signals 800a-800h) to generate the AIC outputs 865a-865h. In this example, the AIC components 860 may select the fixed reference signal(s) based on known sources of acoustic noise, such as microphone(s) associated with loudspeaker(s), with mechanical sources of noise (e.g., appliances, automobile engine, etc.), and/or the like.

In other examples, the AIC components 860 may dynamically select reference signal(s) for each target signal, as described above with regard to the adaptive noise reference configuration 740 or adaptive noise reference configuration 750 illustrated in FIG. 7B. For example, a first AIC component 860a using the first microphone output signal 800a as a first target signal may select the third microphone output signal 800c as a first reference signal, a second AIC component 860b using the second microphone output signal 800b as a second target signal may select the fifth microphone output signal 800e as a second reference signal, and so on. Thus, each of the AIC components 860a-860h may remove individual reference signal(s) from a corresponding target signal (e.g., microphone output signals 800a-800h) to generate the AIC outputs 865a-865h. The examples described above are included for illustrative purposes, but the disclosure is not limited thereto. Instead, multiple microphone output signals may be selected as reference signals for a single target signal and/or the same reference signal(s) may be selected for multiple target signals without departing from the disclosure. In this example, the AIC components 860 may select the reference signal(s) using any technique known to one of skill in the art, including based on signal quality metric(s) and/or the like.

Finally, in some examples the AIC components 860 may select fixed reference signal(s) unique to each target signal, as described above with regard to the single fixed noise reference configuration 710 and/or the double fixed noise reference configuration 720 illustrated in FIG. 7A. For example, a first AIC component 860a using the first microphone output signal 800a as a first target signal may select the fifth microphone output signal 800e as a first reference signal, a second AIC component 860b using the second microphone output signal 800b as a second target signal may select the sixth microphone output signal 800f as a second reference signal, and so on. Thus, each of the AIC components 860a-860h may remove individual reference signal(s) from a corresponding target signal (e.g., microphone output signals 800a-800h) to generate the AIC outputs 865a-865h.

After performing AIC to generate the AIC outputs 865, the device 110 may generate the output audio data 855 using the same techniques described above with regard to FIG. 8A. For example, the AIC outputs 865 may be input to the one or more fixed beamformer (FBF) units 820 to generate FBF outputs 825, the FBF outputs 825 may be input to the speech detector 830 to generate the speech mask data 835, the target/reference selector 840 may select one or more of the FBF outputs 825 as target signal(s) 845a and select one or more of the FBF outputs 825 as reference signal(s) 845b, and the AIC component 850 may generate the output audio data 855 by removing the reference signal(s) 845b from the target signal(s) 845a, with adaptation of the filter coefficient values frozen based on the speech mask data 835.

In contrast to the AEC implementation 802 illustrated in FIG. 8A and the input AIC implementation 804 illustrated in FIG. 8B, FIG. 8C illustrates the beamformed AIC implementation 806, which performs adaptive interference cancellation after beamforming the microphone outputs 800.

As illustrated in FIG. 8C, the microphone outputs 800 (e.g., input audio data captured by the microphone array 114) are input to the one or more fixed beamformer (FBF) units 820 to generate FBF outputs 825 corresponding to a plurality of directions, using the techniques described above with regard to FIG. 8A. Unlike the examples illustrated in FIGS. 8A-8B, the audio data is input to the FBF units 820 prior to performing any echo/interference cancellation.

Thus, to perform the first stage of AIC, the FBF outputs 825 are input to one or more adaptive interference cancellation (AIC) components 870 and the AIC components 870 generate AIC outputs 875. For example, a first AIC component 870a may use a first FBF output signal 825a corresponding to a first direction as a first target signal, a second AIC component 870b may use a second FBF output signal 825b corresponding to a second direction as a second target signal, and so on.

A number of AIC components 870 included in the device 110 may depend on the desired number of beams. For example, if the FBF units 820 generate twelve beams, the device 110 may include twelve AIC components 870 configured to perform adaptive interference cancelling and generate twelve AIC outputs 875. However, the disclosure is not limited thereto and the number of AIC components 875 may vary without departing from the disclosure. For example, a first number of microphones in the microphone array 114 may be associated with a source of noise (e.g., one or more microphones may be placed in proximity to a known source of noise, such as an engine compartment in a vehicle) and the number of AIC components 865 may be equal to a difference between a total number of microphones included in the microphone array 114 and the first number of microphones. In this example, the first number of microphones may be used as a reference signal for the AIC components 865, although the disclosure is not limited thereto. Additionally or alternatively, the device 110 may include several AIC components 860 for a single microphone signal without departing from the disclosure.

The AIC components 870 may select the reference signal(s) using any technique known to one of skill in the art. In some examples, the AIC components 870 may select a fixed reference signal or a fixed group of reference signals to remove from all of the target signals, as described above with regard to the global noise reference configuration 730 illustrated in FIG. 7B. For example, the AIC components 870 may select the second FBF output signal 825b as a global reference signal (or FBF output signals 825b-825d as global reference signals) to be used by all of the AIC components 870. Thus, if there are twelve beams (e.g., FBF output signals 825a-825l) generated by the FBF units 820, each of the AIC components 860a-860l may remove the second FBF output signal 825b from a corresponding target signal (e.g., FBF output signals 825a-825l) to generate the AIC outputs 875a-875l. In this example, the AIC components 870 may select the global reference signal(s) based on known sources of acoustic noise, such as direction(s) associated with loudspeaker(s), with mechanical sources of noise (e.g., appliances, automobile engine, etc.), and/or the like.

In other examples, the AIC components 870 may dynamically select reference signal(s) for each target signal, as described above with regard to the adaptive noise reference configuration 740 or adaptive noise reference configuration 750 illustrated in FIG. 7B. For example, a first AIC component 870a using the first FBF output signal 825a as the first target signal may select the third FBF output signal 825c as a first reference signal, a second AIC component 870b using the second FBF output signal 825b as the second target signal may select the fifth FBF output signal 825e as a second reference signal, and so on. Thus, each of the AIC components 870a-870l may remove individual reference signal(s) from a corresponding target signal (e.g., FBF output signals 825a-825l) to generate the AIC outputs 875a-875l. The examples described above are included for illustrative purposes, but the disclosure is not limited thereto. Instead, multiple FBF output signals may be selected as reference signals for a single target signal and/or the same reference signal(s) may be selected for multiple target signals without departing from the disclosure. In this example, the AIC components 870 may select the reference signal(s) using any technique known to one of skill in the art, including based on signal quality metric(s) and/or the like.

Finally, in some examples the AIC components 870 may select fixed reference signal(s) unique to each target signal, as described above with regard to the single fixed noise reference configuration 710 and/or the double fixed noise reference configuration 720 illustrated in FIG. 7A. For example, a first AIC component 870a using the first FBF output signal 825a as the first target signal may select the seventh FBF output signal 825g as a first reference signal, a second AIC component 870b using the second FBF output signal 825b as the second target signal may select the eighth FBF output signal 825h as a second reference signal, and so on (e.g., an eighth AIC component 870h using the eighth FBF output signal 825g as an eighth target signal may select the first FBF output signal 825a as an eighth reference signal, a ninth AIC component 870h using the ninth FBF output signal 825h as a ninth target signal may select the second FBF output signal 825b as a ninth reference signal, etc.). Thus, each of the AIC components 870a-870l may remove individual reference signal(s) from a corresponding target signal (e.g., FBF output signals 800a-800l) to generate the AIC outputs 875a-875l.

After performing AIC to generate the AIC outputs 875, the device 110 may generate the output audio data 855 using the same techniques described above with regard to FIG. 8A. For example, the AIC outputs 875 may be input to the speech detector 830 to generate the speech mask data 835, the target/reference selector 840 may select one or more of the AIC outputs 875 as target signal(s) 845a and select one or more of the AIC outputs 875 as reference signal(s) 845b, and the AIC component 850 may generate the output audio data 855 by removing the reference signal(s) 845b from the target signal(s) 845a, with adaptation of the filter coefficient values frozen based on the speech mask data 835.

In some examples, the device 110 may generate the output audio data without performing beamforming. For example, the device 110 may select a microphone signal as a reference signal for both the first stage and the second stage of AIC.

As illustrated in FIG. 8D, microphone outputs 800 (e.g., input audio data captured by the microphone array 114) are input to one or more adaptive interference cancellation (AIC) components 860 and the AIC components 860 generate AIC outputs 865. For example, a first AIC component 860a may use a first microphone output signal 800a corresponding to a first microphone as a target signal. The first AIC component 860a may estimate a noise reference signal using at least one of the remaining microphone output signals 800 (e.g., microphone output signals not associated with the first microphone, such as a second microphone output signal 800b corresponding to a second microphone) and may remove the noise reference signal from the first microphone output signal 800a. Thus, the output of the first AIC 860*a* corresponds to audio data associated with the first microphone after noise and/or interference is cancelled from the other microphone(s).

A number of AIC components 860 included in the device 110 may depend on the number of microphones included in the microphone array 114. For example, if there are eight microphones in the microphone array 114, the device 110 may include eight AIC components 860 configured to perform adaptive interference cancelling and generate eight AIC outputs 865. However, the disclosure is not limited thereto and the number of AIC components 865 may vary without departing from the disclosure. For example, a first number of microphones in the microphone array 114 may be associated with a source of noise (e.g., one or more microphones may be placed in proximity to a known source of noise, such as an engine compartment in a vehicle) and the number of AIC components 865 may be equal to a difference between a total number of microphones included in the microphone array 114 and the first number of microphones. In this example, the first number of microphones may be used as a reference signal for the AIC components 865, although the disclosure is not limited thereto. Additionally or alternatively, the device 110 may include several AIC components 860 for a single microphone signal without departing from the disclosure.

The AIC components 860 may select the reference signal(s) using any technique known to one of skill in the art. In some examples, the AIC components 860 may select a fixed reference signal or a fixed group of reference signals to remove from all of the target signals, as described above with regard to the global noise reference configuration 730 illustrated in FIG. 7B. For example, the AIC components 860 may select the second microphone output signal 800*b* as a reference signal (or microphone output signals 800*b*-800*d* as reference signals) to be used by all of the AIC components 860. Thus, if there are eight microphones in the microphone array 114, each of the AIC components 860*a*-860*h* may remove the second microphone output signal 800*b* from a corresponding target signal (e.g., microphone output signals 800*a*-800*h*) to generate the AIC outputs 865*a*-865*h*. In this example, the AIC components 860 may select the fixed reference signal(s) based on known sources of acoustic noise, such as microphone(s) associated with loudspeaker(s), with mechanical sources of noise (e.g., appliances, automobile engine, etc.), and/or the like.

In other examples, the AIC components 860 may dynamically select reference signal(s) for each target signal, as described above with regard to the adaptive noise reference configuration 740 or adaptive noise reference configuration 750 illustrated in FIG. 7B. For example, a first AIC component 860*a* using the first microphone output signal 800*a* as a first target signal may select the third microphone output signal 800*c* as a first reference signal, a second AIC component 860*b* using the second microphone output signal 800*b* as a second target signal may select the fifth microphone output signal 800*e* as a second reference signal, and so on. Thus, each of the AIC components 860*a*-860*h* may remove individual reference signal(s) from a corresponding target signal (e.g., microphone output signals 800*a*-800*h*) to generate the AIC outputs 865*a*-865*h*. The examples described above are included for illustrative purposes, but the disclosure is not limited thereto. Instead, multiple microphone output signals may be selected as reference signals for a single target signal and/or the same reference signal(s) may be selected for multiple target signals without departing from the disclosure. In this example, the AIC components 860 may select the reference signal(s) using any technique known to one of skill in the art, including based on signal quality metric(s) and/or the like.

Finally, in some examples the AIC components 860 may select fixed reference signal(s) unique to each target signal, as described above with regard to the single fixed noise reference configuration 710 and/or the double fixed noise reference configuration 720 illustrated in FIG. 7A. For example, a first AIC component 860*a* using the first microphone output signal 800*a* as a first target signal may select the fifth microphone output signal 800*e* as a first reference signal, a second AIC component 860*b* using the second microphone output signal 800*b* as a second target signal may select the sixth microphone output signal 800*f* as a second reference signal, and so on. Thus, each of the AIC components 860*a*-860*h* may remove individual reference signal(s) from a corresponding target signal (e.g., microphone output signals 800*a*-800*h*) to generate the AIC outputs 865*a*-865*h*.

After performing AIC to generate the AIC outputs 865, the device 110 may input the AIC outputs 865 to the speech detector 830 to generate the speech mask data 835, as described in greater detail above. In addition, the AIC outputs 865 may be input to a target/reference selector 880, which may generate target/reference data 882 by selecting one or more of the AIC outputs 865 as target signal(s) and selecting one or more of the AIC outputs 865 as reference signal(s). Thus, whereas the examples illustrated in FIGS. 8A-8C use the output of the first stage as input to the second stage when generating the output audio data 855, the redundant input AIC implementation 808*a* illustrated in FIG. 8D does not. Instead, an output AIC 884 receives the speech mask data 835 from the speech detector 830 and the target/reference data 882 from the target/reference selector 880, along with each of the microphone outputs 800. The output AIC 884 generates output audio data 886 by removing a first portion of the microphone outputs 800 corresponding to the reference signal(s) from a second portion of the microphone outputs 800 corresponding to the target signal(s), with adaptation of the filter coefficient values frozen based on the speech mask data 835.

FIG. 8E illustrates a second redundant input AIC implementation 808*b* that requires a plurality of AIC components 890 for the second stage. Thus, instead of using the AIC outputs 865 as inputs to the target/reference selector 880 and generating target/reference data 882, as illustrated in FIG. 8D, FIG. 8E illustrates that the second redundant input AIC implementation 808*b* includes an individual AIC component 890 for each of the microphone outputs 800. For example, the speech detector 830 generates the speech mask data 835 and sends the speech mask data 835 to the AIC components 890, which generate a plurality of AIC outputs 892 by removing a portion of the microphone outputs 800 corresponding to individual reference signal(s) from each of the microphone outputs 800 (e.g., target signals), with adaptation of the filter coefficient values frozen based on the speech mask data 835. An output selector 894 may receive the AIC outputs 892 and select a single output as output audio data 896.

Whether the device 110 implements the first stage using the AEC implementation 802 illustrated in FIG. 8A, the input AIC implementation 804 illustrated in FIG. 8B, the beamformed AIC implementation 806 illustrated in FIG. 8C, or the redundant input AIC implementations 808*a*/808*b* illustrated in FIGS. 8D-8E, the device 110 uses the output of the first stage to generate the speech mask data 835. Using the speech mask data 835 to control when the AIC component(s) in the second stage (e.g., AIC component 850/884 or AIC components 890) adapts the filter coefficient values (e.g., speech not detected) or freezes adaptation of the filter coefficient values (e.g., speech detected) reduces distortion associated with the desired speech and/or improves the output audio data 855/886/896.

Figure 9:
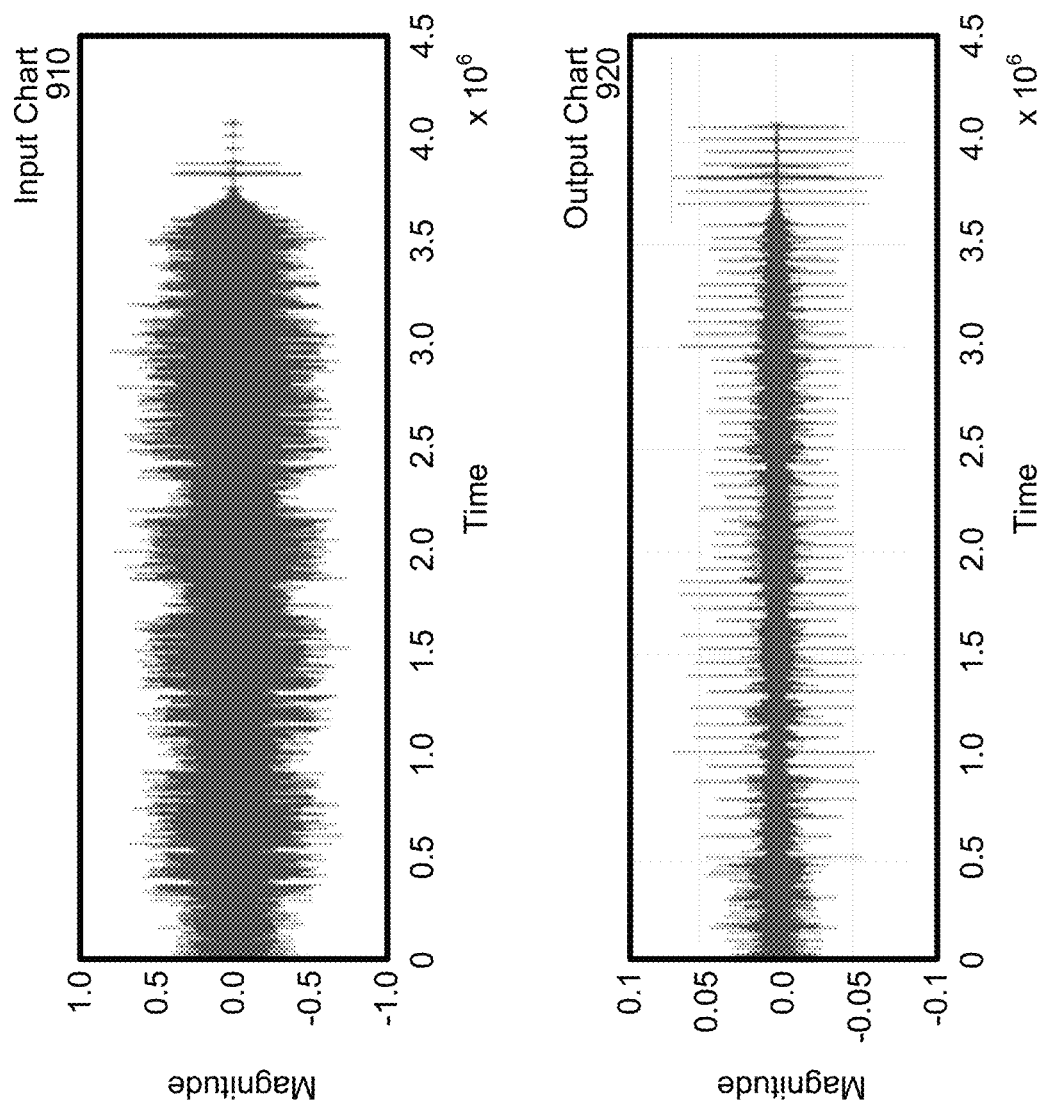
FIG. 9 illustrates an example of output audio data according to embodiments of the present disclosure.

FIG. 9 illustrates an example of output audio data according to embodiments of the present disclosure. As illustrated in FIG. 9, input chart 910 includes a representation of input audio data generated by the microphone array 114 (e.g., microphone outputs 800), whereas output chart 920 includes a representation of output audio data generated after the second stage of adaptive interference cancellation (e.g., output audio data 855). As illustrated in FIG. 9, the output audio data illustrated in the output chart 920 corresponds to a lower noise value and a higher signal-to-noise ratio (SNR) value compared to the input audio data illustrated in the input chart 910, indicating that a quality of the output audio data is much improved over the input audio data.

In some examples, the second stage of AIC may build off of the first stage of AIC, such that the two stages are aligned in series. For example, the beamformed AIC implementation 806 illustrates that the second stage (e.g., AIC component 850) receives the outputs of the first stage (e.g., AIC outputs 875 generated by the AIC components 870), resulting in the device 110 generating the output audio data 855 by performing AIC twice to the same audio data. However, the disclosure is not limited thereto, and the second stage of AIC may be aligned in parallel without departing from the disclosure.

FIGS. 10A-10B illustrate examples of series and parallel implementations according to embodiments of the present disclosure. As illustrated in FIG. 10A, a series AIC implementation 1000 corresponds to the beamformed AIC implementation 806 illustrated in FIG. 8C. For example, the AIC components 870 generate the AIC output signals 875, which are used by the speech detector 830 to generate the speech mask data 835, by the target/reference selector 840 to generate target signal(s) 845a and reference signal(s) 845b, and by the AIC component 850 to generate the output audio data 855.

In contrast, FIG. 10B illustrates a parallel AIC implementation 1010, in which the second stage (e.g., AIC component 850) generates output audio data 1055 based on the FBF output signals 825 instead of the AIC output signals 875. As illustrated in FIG. 10B, the AIC components 870 generate the AIC output signals 875, as described above, but the AIC output signals 875 are only used by the speech detector 830 to generate the speech mask data 835 and by target/reference selector 1020 to generate target/reference data 1025. For example, instead of selecting target signal(s) 845a and reference signal(s) 845b from the AIC output signals 875, as described above with regard to FIG. 8C, the target/reference selector 1020 illustrated in FIG. 10B generates target/reference data 1025 that indicates target signal(s) (e.g., first portion of the FBF output signals 825) and reference signal(s) (e.g., second portion of the FBF output signals 825) to be used by the AIC component 850. Thus, the AIC component 850 may generate output audio data 1055 by removing the reference signal(s) (e.g., second portion of the FBF output signals 825) from the target signal(s) (e.g., first portion of the FBF output signals 825). As discussed above, the AIC component 850 may use the speech mask data 835 to control when to adapt the filter coefficient values (e.g., when speech is not detected) or freeze adaptation of the filter coefficient values (e.g., when speech is detected) while generating the output audio data 1055.

As illustrated in FIG. 10A, the series AIC implementation 1000 corresponds to the device 110 generating the output audio data 855 by performing AIC twice to the same audio data. This may be beneficial as performing AIC twice may reduce the echo signal and/or other acoustic interference in the output audio data 855. In contrast, as illustrated in FIG. 10B, the parallel AIC implementation 1010 corresponds to the device 110 generating the output audio data 1055 by performing AIC a single time to the same audio data, as the AIC outputs 875 generated by the first stage are discarded. This may be beneficial as the first stage may apply strong AIC to improve detection of the speech, which may result in distortion in the output audio data. Thus, the device 110 generates the output audio data 1055 only based on the second stage of AIC performed by the AIC component 850.

While not illustrated, the same concepts may apply to the AEC implementation 802 and the input AIC implementation 804 without departing from the disclosure. For example, the FBF outputs 825 may be used to generate the speech mask data 835 and to determine the target signal(s) 845a and the reference signal(s) 845b, as discussed above with regard to FIGS. 8A-8B. However, the AIC component 850 may generate the output audio data 855 based on the microphone outputs 800 instead of the AEC outputs 815 or the AIC outputs 865. For example, the device 110 may input the microphone outputs 800 to a second stage of beamforming without performing AEC/AIC. Thus, the first stage of AIC may be used to detect speech but the FBF outputs 825 may be discarded. Instead, the AIC component 850 may generate the output audio data 855 based on beamformed audio data that was not processed by the first stage without departing from the disclosure.

Figure 11A:
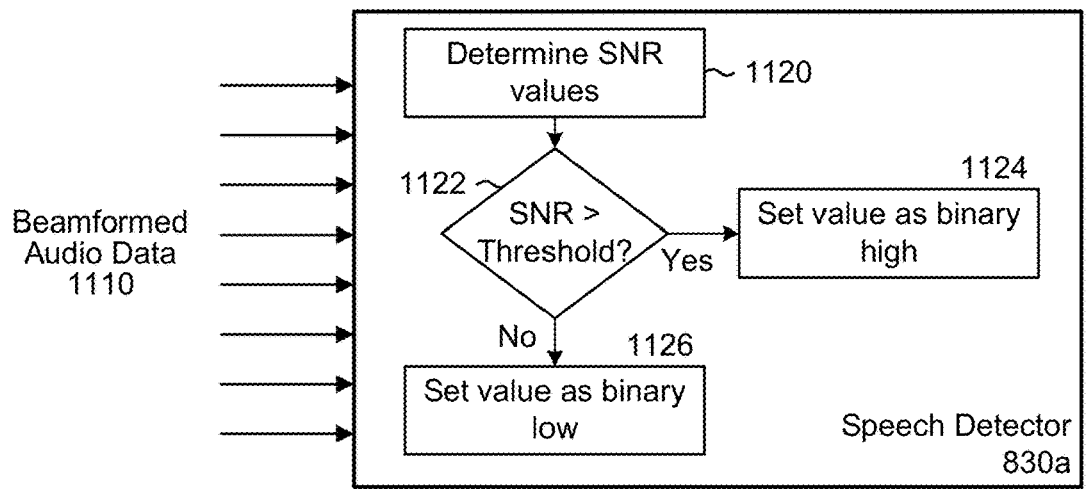
FIGS. 11A-11C illustrate examples of detecting speech according to embodiments of the present disclosure.
Figure 11B:
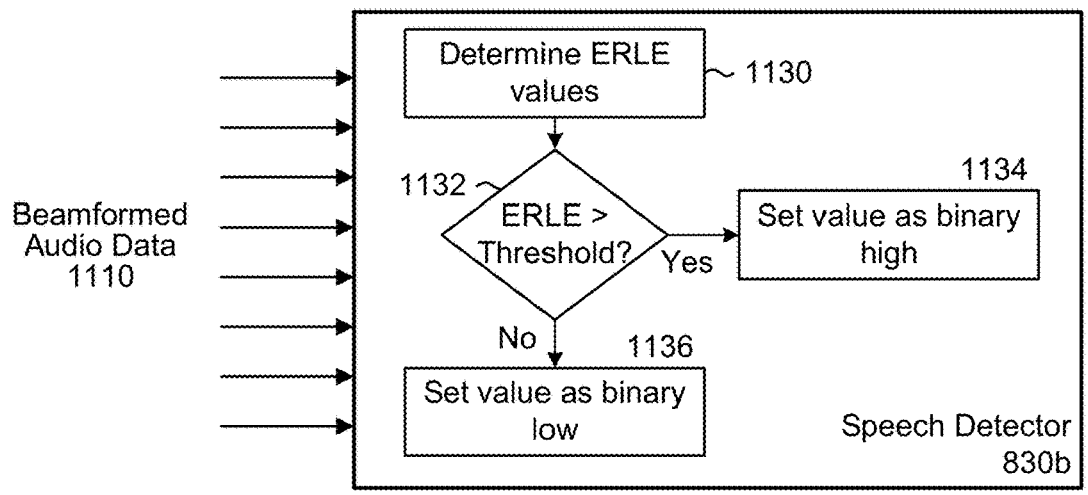
Figure 11C:
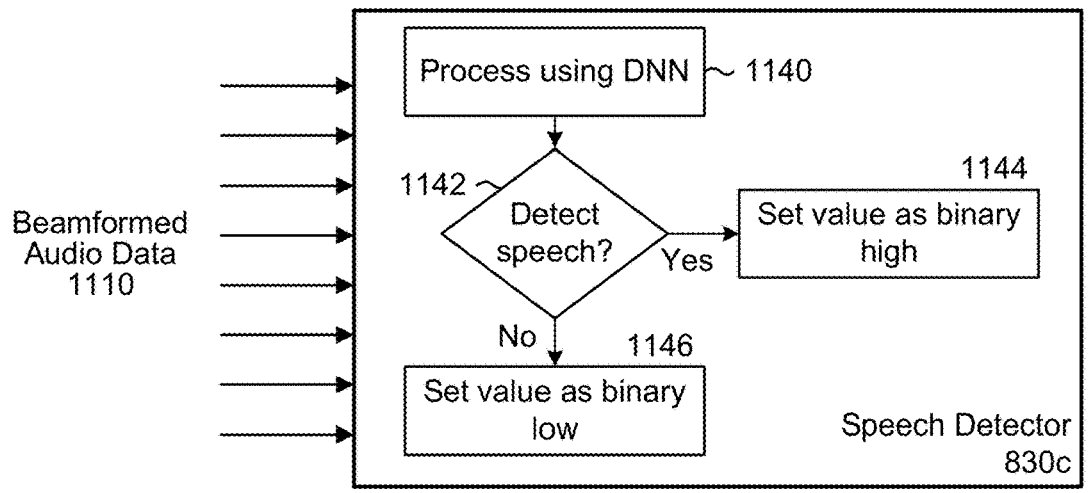

FIGS. 11A-11C illustrate examples of detecting speech according to embodiments of the present disclosure. The device 110 may detect speech using any techniques known to one of skill in the art, including based on signal quality metrics, using a deep neural network (DNN) component (e.g., a first model), and/or the like. For example, FIG. 11A illustrates a first speech detector 830a configured to detect speech based on a signal-to-noise ratio (SNR) value, FIG. 11B illustrates a second speech detector 830b configured to detect speech based on an echo-return loss enhancement (ERLE) value, and FIG. 11C illustrates a third speech detector 830c configured to detect speech using a DNN, although the disclosure is not limited thereto. In some examples, the device 110 may detect speech by determining that a representation of an utterance is included in audio data, although the disclosure is not limited thereto.

As illustrated in FIG. 11A, the first speech detector 830a may receive beamformed audio data 1110 and may determine (1120) SNR values associated with a particular time window (e.g., period of time). For example, the first speech detector 830a may determine an SNR value for each directional output (e.g., beam) included in the beamformed audio data 1110 during a current time window.

After determining the SNR values, the first speech detector 830a may determine (1122) whether any of the SNR values are above a threshold value. If at least one of the directional outputs included in the beamformed audio data 1110 is associated with an SNR value above the threshold value, the first speech detector 830a may set (1124) a corresponding value in the speech mask data (e.g., particular portion of the speech mask data corresponding to the current time window) equal to a binary high (e.g., logic high or a value of one). Thus, if the first speech detector 830a detects speech in any of the beams during the current time window, the speech mask data stores a binary high to indicate that speech is detected in the current time window. If none of the directional outputs included in the beamformed audio data 1110 are associated with an SNR value above the threshold value (e.g., all of the SNR values are below the threshold value), the first speech detector 830a may set (1126) a corresponding value in the speech mask data (e.g., particular portion of the speech mask data corresponding to the current time window) equal to a binary low (e.g., logic low or a value of zero). Thus, if the first speech detector 830a does not detect speech in any of the beams during the current time window, the speech mask data stores a binary low to indicate that speech is not detected in the current time window.

As illustrated in FIG. 11A, the first speech detector 11A30a may analyze the beamformed audio data 1110 over time based on SNR values, with individual values in the speech mask data indicating whether speech is detected in a particular time window in the beamformed audio data 1110.

As illustrated in FIG. 11B, the second speech detector 830b may receive the beamformed audio data 1110 and may determine (1130) ERLE values associated with a particular time window (e.g., period of time). For example, the second speech detector 830b may determine an ERLE value for each directional output (e.g., beam) included in the beamformed audio data 1110 during a current time window.

After determining the ERLE values, the second speech detector 830b may determine (1132) whether any of the ERLE values are above a threshold value. If at least one of the directional outputs included in the beamformed audio data 1110 is associated with an ERLE value above the threshold value, the second speech detector 830b may set (1134) a corresponding value in the speech mask data (e.g., particular portion of the speech mask data corresponding to the current time window) equal to a binary high (e.g., logic high or a value of one). Thus, if the second speech detector 830b detects speech in any of the beams during the current time window, the speech mask data stores a binary high to indicate that speech is detected in the current time window. If none of the directional outputs included in the beamformed audio data 1110 are associated with an ERLE value above the threshold value (e.g., all of the ERLE values are below the threshold value), the second speech detector 830b may set (1136) a corresponding value in the speech mask data (e.g., particular portion of the speech mask data corresponding to the current time window) equal to a binary low (e.g., logic low or a value of zero). Thus, if the second speech detector 830b does not detect speech in any of the beams during the current time window, the speech mask data stores a binary low to indicate that speech is not detected in the current time window.

As illustrated in FIG. 11B, the second speech detector 11A30b may analyze the beamformed audio data 1110 over time based on ERLE values, with individual values in the speech mask data indicating whether speech is detected in a particular time window in the beamformed audio data 1110.

As illustrated in FIG. 11C, the third speech detector 830c may receive the beamformed audio data 1110 and may process (1140) the beamformed audio data using a DNN configured to detect speech (e.g., a first model). For example, the third speech detector 830c may process each directional output (e.g., beam) included in the beamformed audio data 1110 during a current time window using the DNN. In some examples, the DNN may be configured to determine whether a representation of a wakeword (e.g., keyword corresponding to a voice command) is included in the beamformed audio data 1110, although the disclosure is not limited thereto.

The third speech detector 830c may determine (1142) whether speech is detected in the current time window. If the DNN detects speech in at least one of the directional outputs included in the beamformed audio data 1110, the third speech detector 830c may set (1144) a corresponding value in the speech mask data (e.g., particular portion of the speech mask data corresponding to the current time window) equal to a binary high (e.g., logic high or a value of one). Thus, if the DNN detects speech in any of the beams during the current time window, the speech mask data stores a binary high to indicate that speech is detected in the current time window. If the DNN does not detect speech in any of the directional outputs included in the beamformed audio data 1110, the third speech detector 830c may set (1146) a corresponding value in the speech mask data (e.g., particular portion of the speech mask data corresponding to the current time window) equal to a binary low (e.g., logic low or a value of zero). Thus, if the DNN does not detect speech in any of the beams during the current time window, the speech mask data stores a binary low to indicate that speech is not detected in the current time window.

As illustrated in FIG. 11C, the third speech detector 11A30c may process the beamformed audio data 1110 over time using the DNN, with individual values in the speech mask data indicating whether speech is detected in a particular time window in the beamformed audio data 1110.

While FIGS. 11A-11C illustrate several examples of detecting speech, the disclosure is not limited thereto and the device 110 may detect speech using any technique known to one of skill in the art without departing from the disclosure.

Additionally or alternatively, as described above the parallel AIC implementations enable the device 110 to apply strong AEC/AIC processing to the microphone outputs 800 to improve detection of speech without causing distortion in the output audio data. For example, the device 110 may perform the first stage of AIC using parameters that result in improved SNR/ERLE values and/or improves speech detection using the DNN, even though the parameters cause distortion in the speech. Thus, the device 110 may improve speech detection by varying the parameters associated with the first stage of AIC without departing from the disclosure.

Figure 12:
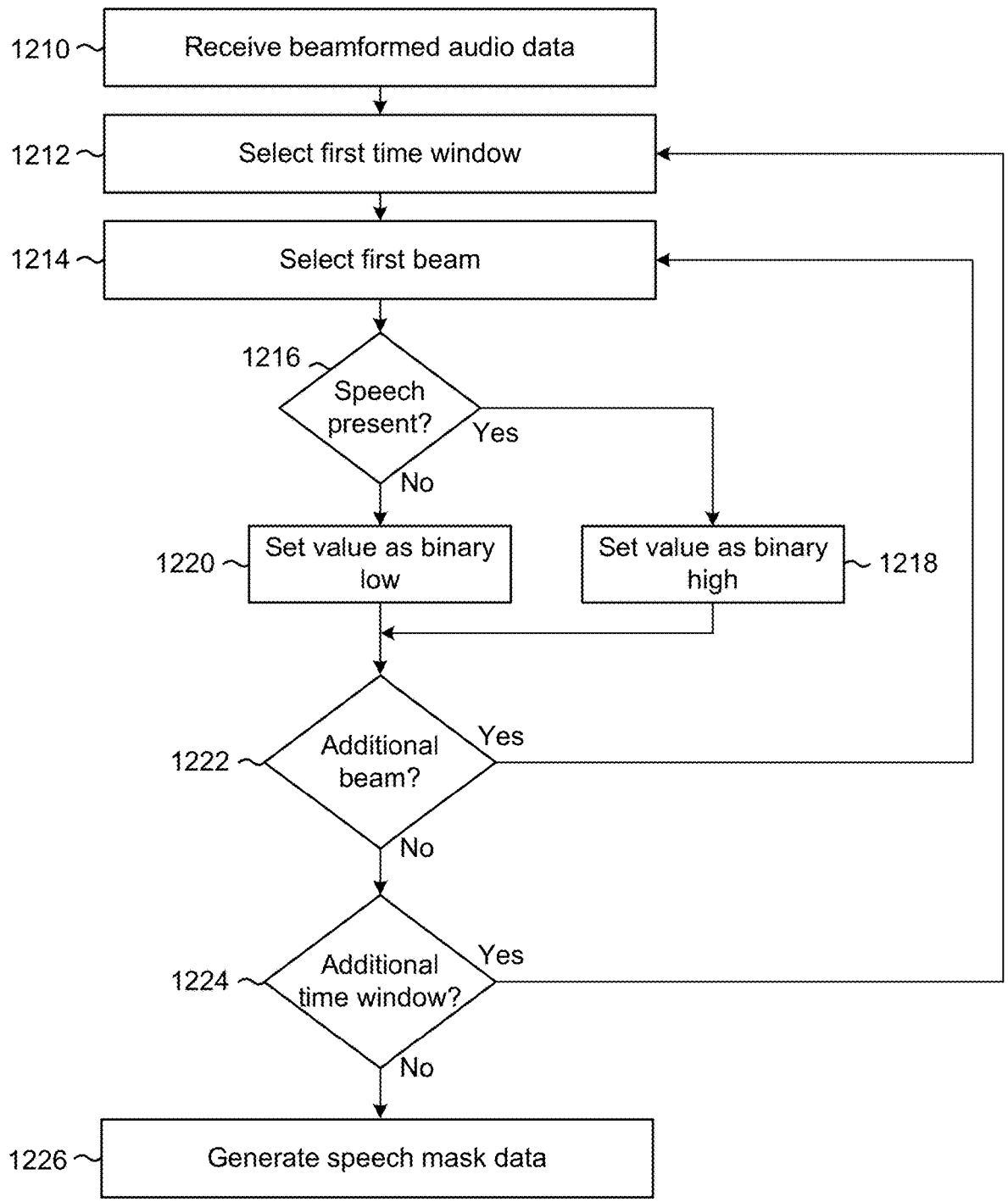
FIG. 12 is a flowchart conceptually illustrating an example method for generating speech mask data according to embodiments of the present disclosure.

FIG. 12 is a flowchart conceptually illustrating an example method for generating speech mask data according to embodiments of the present disclosure. As illustrated in FIG. 12, the device 110 may receive (1210) beamformed audio data, may select (1212) a first time window, may select (1214) a first beam, and may determine (1216) whether speech is present within the first time window in the first beam. If speech is present, the device 110 may set (1218) a corresponding value equal to a binary high, whereas if speech is not present, the device 110 may set (1220) the corresponding value to a binary low.

The device 110 may determine (1222) whether there is an additional beam, and if so, may loop to step 1214 to repeat steps 1214-1220 for the additional beam. If there is not an additional beam, the device 110 may determine (1224) whether there is an additional time window and, if so, may loop to step 1212 and repeat steps 1212-1222 for the additional time window. The device 110 may then generate (1226) the speech mask data, which indicates whether speech is detected within individual time windows of the beamformed audio data.

Figure 13A:
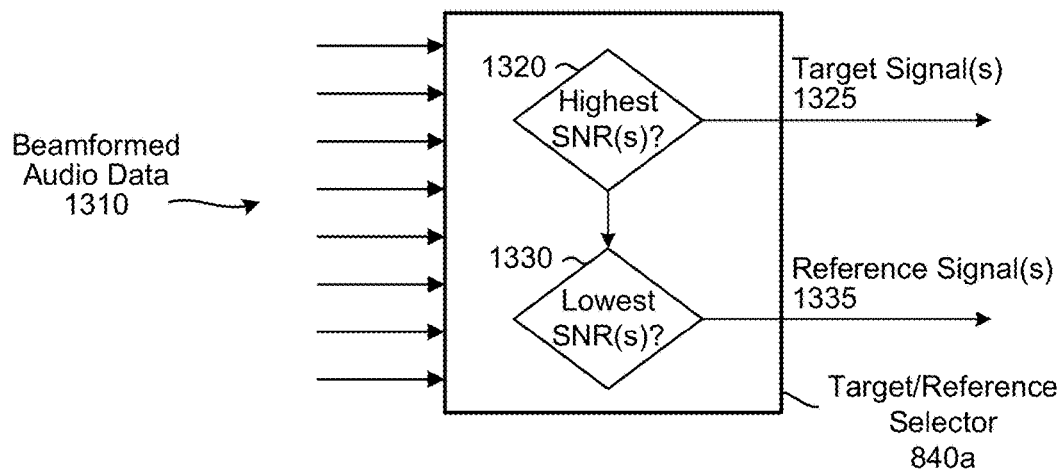
FIGS. 13A-13C illustrate examples of selecting target signals and reference signals according to embodiments of the present disclosure.
Figure 13B:
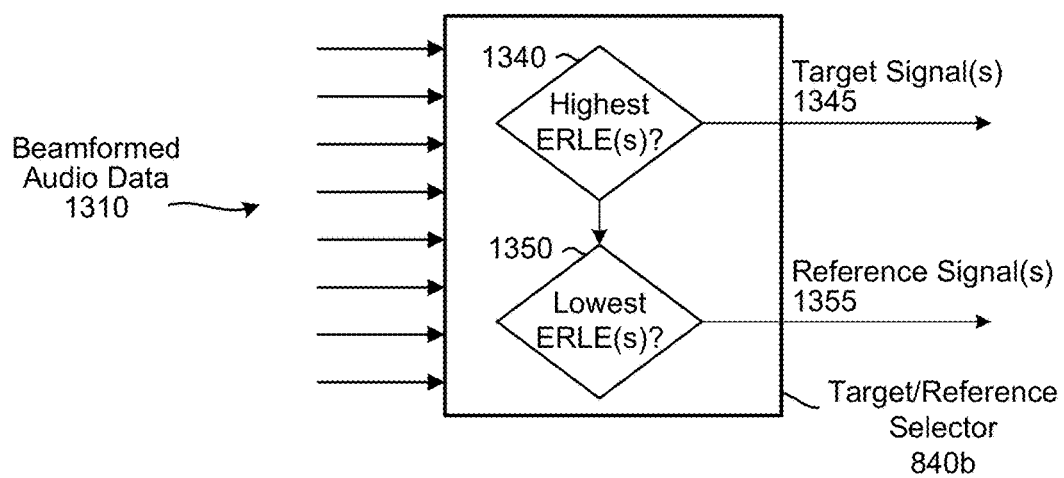
Figure 13C:
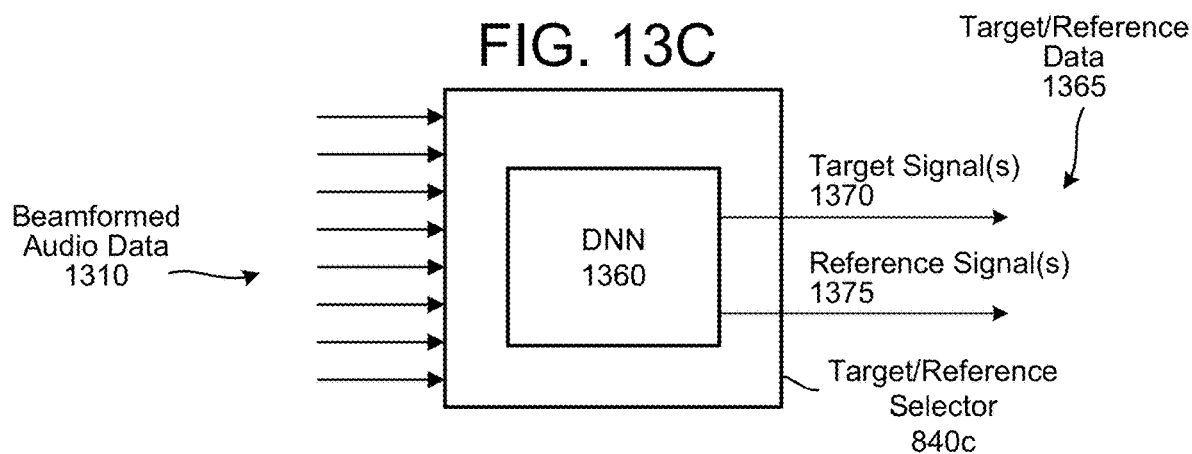

FIGS. 13A-13C illustrate examples of selecting target signals and reference signals according to embodiments of the present disclosure. The device 110 may select target signals and reference signals using any techniques known to one of skill in the art, including based on signal quality metrics, using a deep neural network (DNN) component, and/or the like. For example, FIG. 13A illustrates a first target/reference selector 840a configured to select target signals and reference signals based on a signal-to-noise ratio (SNR) value, FIG. 13B illustrates a second target/reference selector 840*b* configured to select target signals and reference signals based on an echo-return loss enhancement (ERLE) value, and FIG. 13C illustrates a third target/reference selector 840*c* configured to select target signals and reference signals using a DNN, although the disclosure is not limited thereto.

As illustrated in FIG. 13A, the first target/reference selector 840*a* may receive beamformed audio data 1110 and may determine an SNR value for each directional output (e.g., beam) included in the beamformed audio data 1110. After determining the SNR values, the first target/reference selector 840*a* may determine (1320) directional outputs associated with highest SNR value(s) and may select one or more directional outputs as target signal(s) 1325. In some examples, the first target/reference selector 840*a* may select a single directional output associated with a highest SNR value, although the disclosure is not limited thereto. Instead, the first target/reference selector 840*a* may select several directional outputs associated with the highest SNR values as the target signal(s) 1325 without departing from the disclosure. Additionally or alternatively, the first target/reference selector 840*a* may select one or more directional outputs that are not associated with the highest SNR values without departing from the disclosure.

Similarly, the first target/reference selector 840*a* may determine (1330) directional outputs associated with lowest SNR value(s) and may select one or more directional outputs as reference signal(s) 1335. In some examples, the first target/reference selector 840*a* may select a single directional output associated with a lowest SNR value, although the disclosure is not limited thereto. Instead, the first target/reference selector 840*a* may select several directional outputs associated with the lowest SNR values as the reference signal(s) 1335 without departing from the disclosure. Additionally or alternatively, the first target/reference selector 840*a* may select one or more directional outputs that are not associated with the lowest SNR values without departing from the disclosure.

As illustrated in FIG. 13B, the second target/reference selector 840*b* may receive the beamformed audio data 1110 and may determine an echo-return loss enhancement (ERLE) value for each directional output (e.g., beam) included in the beamformed audio data 1110. After determining the ERLE values, the second target/reference selector 840*b* may determine (1340) directional outputs associated with highest ERLE value(s) and may select one or more directional outputs as target signal(s) 1345. In some examples, the second target/reference selector 840*b* may select a single directional output associated with a highest ERLE value, although the disclosure is not limited thereto. Instead, the second target/reference selector 840*b* may select several directional outputs associated with the highest ERLE values as the target signal(s) 1345 without departing from the disclosure. Additionally or alternatively, the second target/reference selector 840*b* may select one or more directional outputs that are not associated with the highest ERLE values without departing from the disclosure.

Similarly, the second target/reference selector 840*b* may determine (1350) directional outputs associated with lowest ERLE value(s) and may select one or more directional outputs as reference signal(s) 1355. In some examples, the second target/reference selector 840*b* may select a single directional output associated with a lowest ERLE value, although the disclosure is not limited thereto. Instead, the second target/reference selector 840*b* may select several directional outputs associated with the lowest ERLE values as the reference signal(s) 1355 without departing from the disclosure. Additionally or alternatively, the second target/reference selector 840*b* may select one or more directional outputs that are not associated with the lowest ERLE values without departing from the disclosure.

While not illustrated in FIGS. 13A-13B, in some examples the target/reference selector 840 may select the target signal(s) and the reference signal(s) based on a combination of the SNR values and the ERLE values without departing from the disclosure. Additionally or alternatively, the target/reference selector 840 may select the target signal(s) and the reference signal(s) using any technique known to one of skill in the art, including using other signal quality metrics not illustrated herein.

As illustrated in FIG. 13C, the third target/reference selector 840*c* may receive the beamformed audio data 1110 and may process the beamformed audio data 1110 using a DNN 1360 configured to generate target/reference data 1365. For example, the third target/reference selector 840*c* may process each directional output (e.g., beam) included in the beamformed audio data 1110 using the DNN 1360 and the DNN 1360 may select target signal(s) 1370 and reference signal(s) 1375. The DNN 1360 may select one or more of the directional outputs as the target signal(s) 1370 and may select one or more of the directional outputs as the reference signal(s) 1375 based on signal quality metrics or other criteria known to one of skill in the art.

Figure 14B:
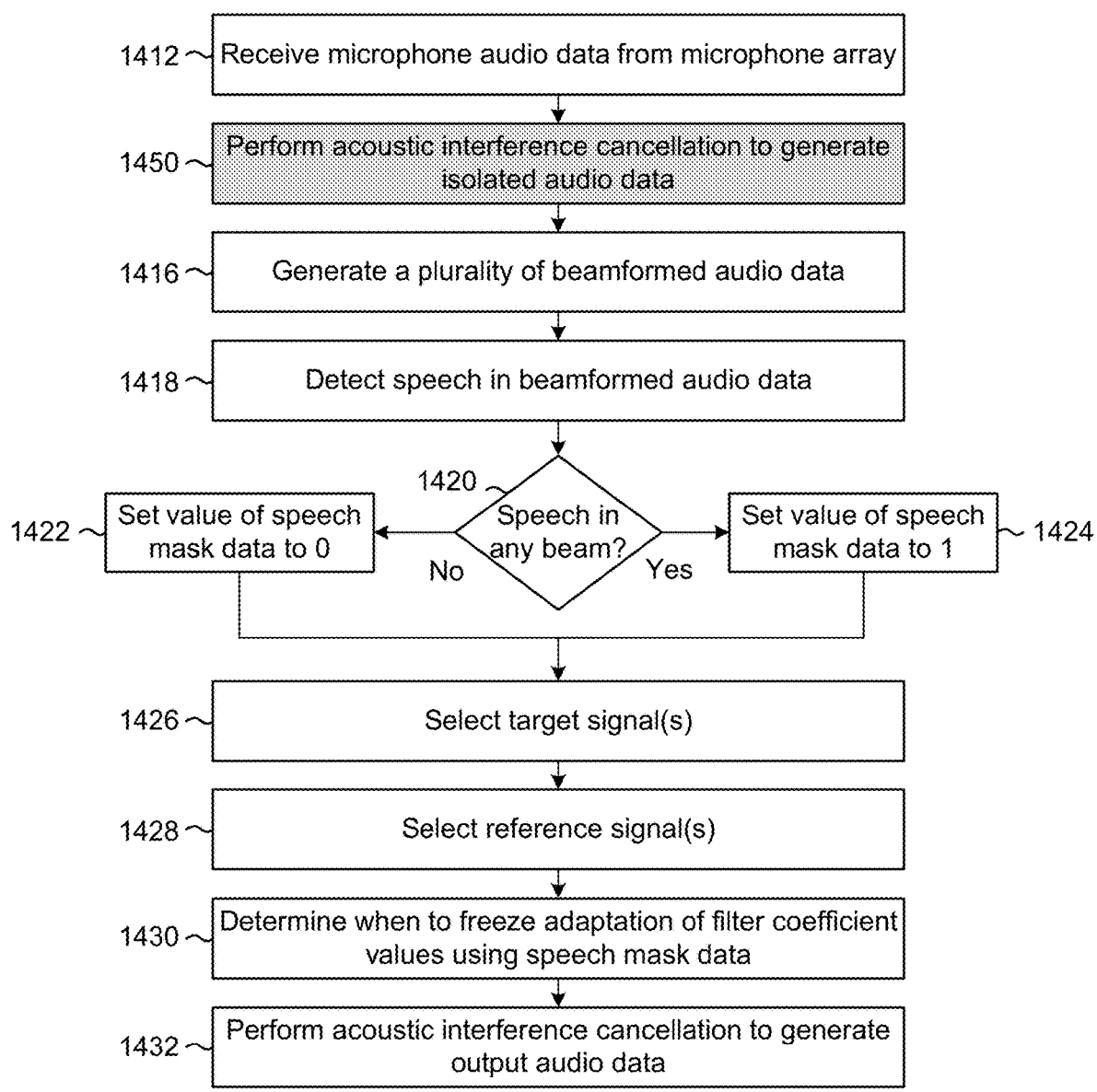

FIGS. 14A-14C are flowcharts conceptually illustrating example methods for generating output audio using cascaded adaptive interference algorithms according to embodiments of the present disclosure. FIG. 14A illustrates a first example method corresponding to the AEC implementation 802 illustrated in FIG. 8A, FIG. 14B illustrates a second example method corresponding to the input AIC implementation 804 illustrated in FIG. 8B, and FIG. 14C illustrates a third example method corresponding to the beamformed AIC implementation 806.

As illustrated in FIG. 14A, the device 110 may receive (1410) playback audio data (e.g., playback audio data sent to the loudspeaker(s) 116), may receive (1412) microphone audio data from the microphone array 114, and may perform (1414) acoustic echo cancellation to generate isolated audio data. For example, the device 110 may remove the playback audio data from a portion of the microphone audio data associated with each individual microphone. Thus, if the microphone array 114 includes 8 microphones, the device 110 may perform acoustic echo cancellation 8 times using microphone audio data from each of the microphones as a target signal once.

The device 110 may generate (1416) a plurality of beamformed audio data based on the isolated audio data. For example, the device 110 may perform beamforming to generate directional outputs (e.g., beams) associated with a plurality of directions. As discussed above, the number of directional outputs may be different than the number of microphones, although the disclosure is not limited thereto. The device 110 may then detect (1418) speech in the beamformed audio data and determine (1420) whether speech is detected in any of the directional outputs (e.g., in any beam). If speech is not detected, the device 110 may set (1422) a corresponding value of the speech mask data to a binary low (e.g., digital low or equal to zero), whereas if speech is detected in any of the directional outputs the device 110 may set (1424) the corresponding value of the speech mask data to a binary high (e.g., digital high or equal to one).

While the examples described above refer to indicating that speech is present using a binary high value (and therefore indicating that speech is not present using a binary low value), the disclosure is not limited thereto. Instead, the device 110 may indicate that speech is present using a binary low value (and therefore indicate that speech is not present using a binary high value) without departing from the disclosure.

Additionally or alternatively, in some examples the device 110 may determine a non-binary value and store the non-binary value in the speech mask data without departing from the disclosure. For example, the device 110 may determine a confidence value (e.g., a continuous value between zero and one) that indicates a confidence level that speech is detected in the beamformed audio data without departing from the disclosure. The device 110 may adapt the filter coefficient values based on the confidence value, such that a low value (e.g., 0.1) indicating a low confidence that speech is present corresponds to a high adaptation weight (e.g., 0.9, or 90% of normal adaptation) and a high value (e.g., 0.8) indicating a high confidence that speech is present corresponds to a low adaptation weight (e.g., 0.2, or 20% of normal adaptation). Thus, the device 110 does not completely freeze adaptation when speech is detected but reduces an amount of adaptation based on the confidence value associated with speech being present.

The device 110 may select (1426) target signal(s), select (1428) reference signal(s), determine (1430) when to freeze adaptation of filter coefficient values using the speech mask data, and may perform (1432) adaptive interference cancellation to generate output audio data. For example, the device 110 may disable (e.g., freeze) adaptation of the filter coefficient values (e.g., not update the filter coefficient values) when speech is detected in the beamformed audio data and may enable adaptation of the filter coefficient values (e.g., update the filter coefficient values) when speech is not detected in the beamformed audio data.

To illustrate an example, the device 110 may determine that speech is detected in a first time window of the beamformed audio data (e.g., the first time window of the beamformed audio data includes a representation of an utterance). Thus, the device 110 may determine fixed filter coefficient values at a beginning of the first time window and may store the fixed filter coefficient values and not update the filter coefficient values until speech is no longer detected in the beamformed audio data. For example, at a beginning of the first time window the device 110 may determine a set of respective values for a plurality of variable filter coefficient values of an adaptive filter and may use the set of respective values (without updating or adaptation) while processing the first time window of the beamformed audio data. Once speech is no longer present in the beamformed audio data (e.g., in a second time window of the beamformed audio data), the device 110 may enable adaptation of the variable filter coefficient values. Thus, the device 110 may update the variable filter coefficient values while processing the second time window of the beamformed audio data.

As discussed above, the target signal(s) may correspond to one or more directional outputs included in the beamformed audio data (e.g., first portion of the beamformed audio data) and the reference signal(s) may correspond to one or more directional outputs included in the beamformed audio data (e.g., second portion of the beamformed audio data). Thus, the device 110 may remove the second portion of the beamformed audio data from the first portion of the beamformed audio data to generate the output audio data.

As discussed above, FIG. 14B illustrates a second example method corresponding to the input AIC implementation 804 illustrated in FIG. 8B. As illustrated in FIG. 14B, the device 110 may receive (1412) the microphone audio data from the microphone array 114, and may perform (1450) adaptive interference cancellation to generate isolated audio data. For example, the microphone audio data may comprise a plurality of microphone signals and the device 110 may select each of the microphone signals as a target signal and perform adaptive interference cancellation. Thus, if the microphone array 114 includes eight microphones, the device 110 may perform adaptive interference cancellation eight times to generate eight isolated signals (e.g., isolated audio data). For each microphone signal, the device 110 may select one or more of the remaining microphone signals as reference signal(s). The device 110 may select the reference signal(s) using different techniques, such as selecting global reference signal(s) for all target signals (e.g., selecting a first microphone signal associated with a noise source as a reference signal for each of the target signals), selecting reference signal(s) for each target signal using a fixed configuration (e.g., selecting a first microphone signal as a first target signal and a fifth microphone signal as a first reference signal, selecting the second microphone signal as a second target signal and a sixth microphone signal as a second reference signal, etc.), dynamically selecting reference signal(s) for each target signal (e.g., selecting one or more microphone signals for each target signal based on signal quality metrics or the like), a combination thereof, and/or the like. However, the examples described above are provided for illustrative purposes only. The disclosure is not limited thereto and the device 110 may select the reference signal(s) using any technique known to one of skill in the art.

Using the isolated audio data generated in step 1450, the device 110 may perform steps 1416-1432 as described above with regard to FIG. 14A. Thus, the device 110 may generate (1416) a plurality of beamformed audio data based on the isolated audio data, may detect (1418) speech in the beamformed audio data and determine (1420) whether speech is detected in any of the directional outputs (e.g., in any beam). If speech is not detected, the device 110 may set (1422) a corresponding value of the speech mask data to a binary low (e.g., digital low or equal to zero), whereas if speech is detected in any of the directional outputs the device 110 may set (1424) the corresponding value of the speech mask data to a binary high (e.g., digital high or equal to one). The device 110 may select (1426) target signal(s), select (1428) reference signal(s), determine (1430) when to freeze adaptation of filter coefficient values using the speech mask data, and may perform (1432) adaptive interference cancellation to generate output audio data.

Thus, the second example method illustrated in FIG. 14B is similar to the first example method illustrated in FIG. 14A, except that the device 110 performs adaptive interference cancellation (using the microphone signals as reference signal(s)) instead of performing acoustic echo cancellation (using the playback audio data as a reference signal).

In contrast, FIG. 14C illustrates a third example method corresponding to the beamformed AIC implementation 806. The third example method is similar to the second example method, except that adaptive interference cancellation is performed after beamforming the microphone signals, instead of prior to beamforming.

As illustrated in FIG. 14C, the device 110 may receive (1412) the microphone audio data from the microphone array 114 and may generate (1460) a plurality of beamformed audio data based on the microphone audio data.

While step 1416 illustrated in FIGS. 14A-14B performs beamforming on the isolated audio data, step 1460 performs beamforming on the microphone audio data prior to performing AIC.

After generating the beamformed audio data, the device 110 may perform (1462) adaptive interference cancellation on the beamformed audio data to generate isolated audio data. For example, the beamformed audio data may comprise a plurality of directional outputs and the device 110 may select each of the directional outputs as a target signal and perform adaptive interference cancellation. Thus, if the beamformed audio data corresponds to twelve directional outputs (e.g., beams), the device 110 may perform adaptive interference cancellation twelve times to generate twelve isolated signals (e.g., isolated audio data). For each directional output, the device 110 may select one or more of the remaining directional outputs as reference signal(s). The device 110 may select the reference signal(s) using different techniques, such as selecting global reference signal(s) for all target signals (e.g., selecting a first directional output associated with a noise source as a reference signal for each of the target signals), selecting reference signal(s) for each target signal using a fixed configuration (e.g., selecting a first directional output as a first target signal and a seventh directional output as a first reference signal, selecting the second directional output as a second target signal and an eighth directional output as a second reference signal, etc.), dynamically selecting reference signal(s) for each target signal (e.g., selecting one or more directional outputs for each target signal based on signal quality metrics or the like), a combination thereof, and/or the like. However, the examples described above are provided for illustrative purposes only. The disclosure is not limited thereto and the device 110 may select the reference signal(s) using any technique known to one of skill in the art.

The device 110 may detect (1464) speech in the isolated audio data and determine (1420) whether speech is detected in any of the directional outputs (e.g., in any beam) of the isolated audio data. If speech is not detected, the device 110 may set (1422) a corresponding value of the speech mask data to a binary low (e.g., digital low or equal to zero), whereas if speech is detected in any of the directional outputs the device 110 may set (1424) the corresponding value of the speech mask data to a binary high (e.g., digital high or equal to one). The device 110 may select (1426) target signal(s), select (1428) reference signal(s), determine (1430) when to freeze adaptation of filter coefficient values using the speech mask data, and may perform (1432) adaptive interference cancellation to generate output audio data.

Figure 15:
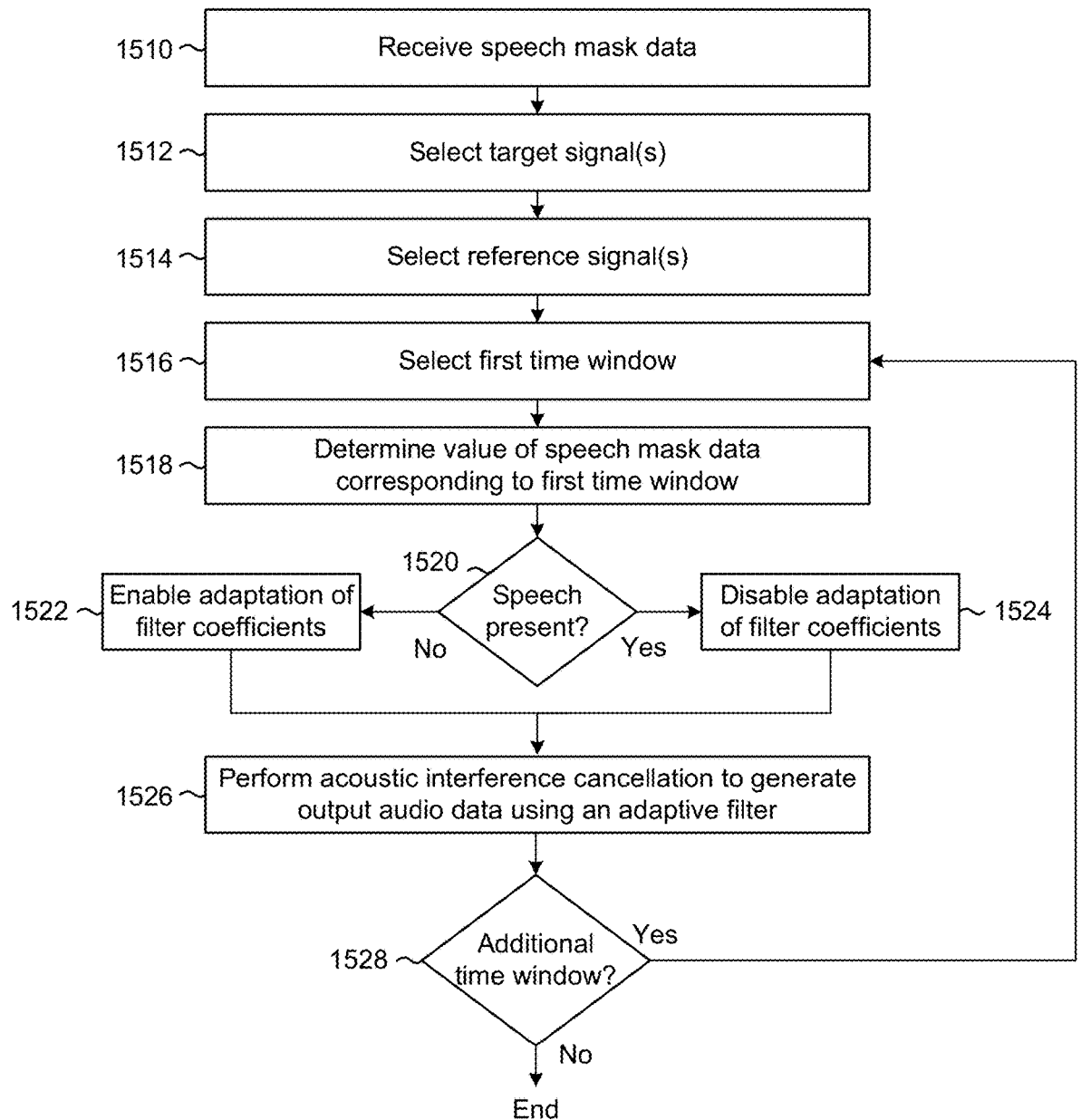
FIG. 15 is a flowchart conceptually illustrating an example method for performing adaptive interference cancellation according to embodiments of the present disclosure.

FIG. 15 is a flowchart conceptually illustrating an example method for performing adaptive interference cancellation according to embodiments of the present disclosure. As illustrated in FIG. 15, the device 110 may receive (1510) speech mask data indicating whether speech is detected in different time windows within audio data, may select (1512) target signal(s), and may select (1514) reference signal(s). For example, the device 110 may select one or more directional outputs as the target signal(s) and may select one or more directional outputs as the reference signal(s), as described above with regard to FIGS. 13A-13C.

The device 110 may select (1516) a first time window, may determine (1518) a value of the speech mask data corresponding to the first time window and may determine (1520) whether speech is present in any of the directional outputs based on the value. For example, the speech mask data may indicate that speech is present using a first binary value (e.g., value of one) and indicate that speech is not present using a second binary value (e.g., value of zero). Thus, if the device 110 determines that speech is not present, the device 110 may enable (1522) adaptation of filter coefficient values associated with an adaptive filter, whereas if the device 110 determines that speech is present, the device 110 may disable (1524) adaptation of filter coefficient values associated with the adaptive filter.

The device 110 may perform (1526) adaptive interference cancellation to generate output audio data using the adaptive filter. For example, the device 110 may remove (e.g., subtract) the reference signal(s) determined in step 1514 from the target signal(s) determined in step 1512. When speech is not detected and adaptation of the filter coefficient values is enabled, the adaptive filter may adapt the filter coefficient values to minimize an error signal (e.g., difference between the reference signal(s) and the target signal(s)). Thus, the adaptive filter may converge to a steady-state value corresponding to a majority of the reference signal(s) subtracted from the target signal(s). However, when speech is detected and adaptation of the filter coefficient values is disabled, the adaptive filter may freeze the filter coefficient values (e.g., store the filter coefficient values and continue using the stored filter coefficient values until adaptation is enabled). Thus, the output of the adaptive filter corresponds to desired speech.

FIG. 16 illustrates examples of speech mask data according to embodiments of the present disclosure. As illustrated in FIG. 16, the speech mask data can be determined in the time domain, in the frequency domain, for individual frequency ranges within the frequency domain, in the subband domain, and/or the like without departing from the disclosure. For example, FIG. 16 illustrates first mask data 1610 corresponding to the time domain. Thus, the first mask data 1610 represents whether speech is present within individual units of time in a time index t. In contrast, second mask data 1610 corresponds to the frequency domain, representing whether speech is present within an individual frame index n. Thus, the second mask data 1620 indicates that speech is detected regardless of whether speech is detected in a single frequency or a plurality of frequencies. Finally, third mask data 1630 corresponds to the frequency domain, representing whether speech is present within an individual frame index n for each frequency index k (e.g., frequency band, frequency subband, frequency range, etc.). Using the third mask data 1630, the device 110 may freeze adaptation of filter coefficient values for individual frequency indexes, enabling adaptation of the filter coefficient values for remaining frequency indexes.

As represented by the examples of speech mask data illustrated in FIG. 16, the device 110 may determine whether speech is detected in the time domain, the frequency domain, the subband domain, and/or the like without departing from the disclosure. In addition, the device 110 may enable or disable adaptation with varying degrees of specificity, including whether speech is detected within any directional output (e.g., beam) regardless of frequency index k, whether speech is detected within any directional output for a specific frequency index k, and/or using any technique known to one of skill in the art without departing from the present disclosure.

FIG. 17 is a block diagram conceptually illustrating example components of the device 110. In operation, the device 110 may include computer-readable and computer-executable instructions that reside on the device, as will be discussed further below.

The device 110 may include one or more audio capture device(s), such as a microphone array 114 which may include a plurality of microphones 502. The audio capture device(s) may be integrated into a single device or may be separate.

The device 110 may also include an audio output device for producing sound, such as loudspeaker(s) 116. The audio output device may be integrated into a single device or may be separate.

The device 110 may include an address/data bus 1724 for conveying data among components of the device 110. Each component within the device may also be directly connected to other components in addition to (or instead of) being connected to other components across the bus 1724.

The device 110 may include one or more controllers/processors 1704, that may each include a central processing unit (CPU) for processing data and computer-readable instructions, and a memory 1706 for storing data and instructions. The memory 1706 may include volatile random access memory (RAM), non-volatile read only memory (ROM), non-volatile magnetoresistive (MRAM) and/or other types of memory. The device 110 may also include a data storage component 1708, for storing data and controller/processor-executable instructions (e.g., instructions to perform operations discussed herein). The data storage component 1708 may include one or more non-volatile storage types such as magnetic storage, optical storage, solid-state storage, etc. The device 110 may also be connected to removable or external non-volatile memory and/or storage (such as a removable memory card, memory key drive, networked storage, etc.) through the input/output device interfaces 1702.

Computer instructions for operating the device 110 and its various components may be executed by the controller(s)/processor(s) 1704, using the memory 1706 as temporary "working" storage at runtime. The computer instructions may be stored in a non-transitory manner in non-volatile memory 1706, storage 1708, or an external device. Alternatively, some or all of the executable instructions may be embedded in hardware or firmware in addition to or instead of software.

The device 110 may include input/output device interfaces 1702. A variety of components may be connected through the input/output device interfaces 1702, such as the microphone array 114, the loudspeaker(s) 116, and a media source such as a digital media player (not illustrated). The input/output interfaces 1702 may include A/D converters (not illustrated) and/or D/A converters (not illustrated).

The input/output device interfaces 1702 may also include an interface for an external peripheral device connection such as universal serial bus (USB), FireWire, Thunderbolt or other connection protocol. The input/output device interfaces 1702 may also include a connection to one or more networks 1799 via an Ethernet port, a wireless local area network (WLAN) (such as WiFi) radio, Bluetooth, and/or wireless network radio, such as a radio capable of communication with a wireless communication network such as a Long Term Evolution (LTE) network, WiMAX network, 3G network, etc. Through the network 1799, the device 110 may be distributed across a networked environment.

Multiple devices may be employed in a single device 110. In such a multi-device device, each of the devices may include different components for performing different aspects of the processes discussed above. The multiple devices may include overlapping components. The components listed in any of the figures herein are exemplary, and may be included a stand-alone device or may be included, in whole or in part, as a component of a larger device or system. For example, certain components such as an FBF unit 440 (including filter and sum component 430) and adaptive noise canceller (ANC) unit 460 may be arranged as illustrated or may be arranged in a different manner, or removed entirely and/or joined with other non-illustrated components.

The concepts disclosed herein may be applied within a number of different devices and computer systems, including, for example, general-purpose computing systems, multimedia set-top boxes, televisions, stereos, radios, server-client computing systems, telephone computing systems, laptop computers, cellular phones, personal digital assistants (PDAs), tablet computers, wearable computing devices (watches, glasses, etc.), other mobile devices, etc.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of digital signal processing and echo cancellation should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk and/or other media. Some or all of the adaptive noise canceller (ANC) unit 460, adaptive beamformer (ABF) unit 490, etc. may be implemented by a digital signal processor (DSP).

As used in this disclosure, the term "a" or "one" may include one or more items unless specifically stated otherwise. Further, the phrase "based on" is intended to mean "based at least in part on" unless specifically stated otherwise.

What is claimed is:
1. A system comprising:
at least one processor; and
at least one memory comprising instructions that, when executed by the at least one processor, cause the system to:
receive first audio data associated with a first microphone;
receive second audio data associated with a second microphone;
determine, based on the first audio data and the second audio data, a first plurality of audio signals comprising:
a first audio signal corresponding to a first direction, and
a second audio signal corresponding to a second direction;
generate third audio data by subtracting the second audio signal from the first audio signal;
generate fourth audio data by subtracting the first audio signal from the second audio signal;

determine that speech is not detected in a first portion of the third audio data corresponding to a first time range;
detect that a second portion of the third audio data includes a representation of speech, the second portion of the third audio data corresponding to a second time range; and
generate, using an adaptive filter, fifth audio data by subtracting the fourth audio data from the third audio data, wherein adaptive filter coefficients of the adaptive filter are updated while processing a first portion of the fifth audio data corresponding to the first time range but not updated while processing a second portion of the fifth audio data corresponding to the second time range.

2. The system of claim 1, wherein the at least one memory further comprises instructions that, when executed by the at least one processor, further cause the system to:
generate a second plurality of audio signals based on the first plurality of audio signals, the second plurality of audio signals including the third audio data and the fourth audio data;
determine, based on the third audio data having a highest signal quality metric value of the second plurality of audio signals, that the third audio data corresponds to a target signal; and
determine, based on the fourth audio data having a lowest signal quality metric value of the second plurality of audio signals, that the fourth audio data corresponds to a reference signal,
wherein the fifth audio data is generated by subtracting the reference signal from the target signal.

3. The system of claim 1, wherein the at least one memory further comprises instructions that, when executed by the at least one processor, further cause the system to:
generate a second plurality of audio signals based on the first plurality of audio signals, the second plurality of audio signals including the third audio data and the fourth audio data;
determine, based on the third audio data having a highest echo-return loss enhancement (ERLE) value of the second plurality of audio signals, that the third audio data corresponds to a target signal; and
determine, based on the fourth audio data having a lowest ERLE value of the second plurality of audio signals, that the fourth audio data corresponds to a reference signal,
wherein the fifth audio data is generated by subtracting the reference signal from the target signal.

4. The system of claim 1, wherein the at least one memory further comprises instructions that, when executed by the at least one processor, further cause the system to:
in response to determining that speech is not detected in the first portion of the third audio data, set a first value in speech mask data, the first value indicating that speech is not detected during the first time range; and
in response to detecting that the second portion of the third audio data includes the representation of the speech, set a second value in the speech mask data, the second value indicating that speech is detected during the second time range,
wherein the adaptive filter coefficients of the adaptive filter are updated based on the speech mask data.

5. The system of claim 1, wherein the instructions that cause the system to generate the fifth audio data further comprise instructions that, when executed by the at least one processor, cause the system to:
generate, using the adaptive filter, a first portion of the fifth audio data by subtracting a first portion of the fourth audio data from the first portion of the third audio data, wherein the first portion of the fifth audio data and the first portion of the fourth audio data correspond to the first time range, and wherein the adaptive filter updates the adaptive filter coefficients while generating the first portion of the fifth audio data;
determine that speech is detected in the second time range;
determine a first set of respective values corresponding to the adaptive filter coefficients at a beginning of the second time range; and
generate, using the adaptive filter and the first set of respective values, a second portion of the fifth audio data by subtracting a second portion of the fourth audio data from the second portion of the third audio data, wherein the second portion of the fifth audio data and the second portion of the fourth audio data corresponding to the second time range.

6. The system of claim 1, wherein the at least one memory: further comprises instructions that, when executed by the at least one processor, further cause the system to:
detect, using a first model, a representation of a wakeword included in the second portion of the third audio data, and
set a first value in speech mask data, the first value indicating that speech is detected during the second time range,
wherein the adaptive filter coefficients of the adaptive filter are updated based on the speech mask data.

7. A computer-implemented method, the method comprising:
receiving first audio data associated with a first microphone;
receiving second audio data associated with a second microphone;
determining, based on the first audio data and the second audio data, a first plurality of audio signals comprising:
a first audio signal corresponding to a first direction, and
a second audio signal corresponding to a second direction;
generating third audio data by subtracting the second audio signal from the first audio signal;
generating fourth audio data by subtracting the first audio signal from the second audio signal;
determining that speech is not detected in a first portion of the third audio data corresponding to a first time range;
detecting that a second portion of the third audio data includes a representation of speech, the second portion of the third audio data corresponding to a second time range;
setting a first value in speech mask data, the first value indicating that speech is detected during the second time range; and
generating, using the speech mask data and an adaptive filter, fifth audio data, wherein adaptive filter coefficients of the adaptive filter are updated based on the speech mask data.

8. The computer-implemented method of claim 7, wherein generating the fifth audio data further comprises:
generating, using the speech mask data and the adaptive filter, the fifth audio data by subtracting the fourth audio data from the third audio data, wherein the adaptive filter coefficients of the adaptive filter are updated based on the speech mask data.

9. The computer-implemented method of claim 7, wherein generating the fifth audio data further comprises:
  generating, using the speech mask data and the adaptive filter, the fifth audio data by subtracting the second audio signal from the first audio signal, wherein the adaptive filter coefficients of the adaptive filter are updated based on the speech mask data.

10. The computer-implemented method of claim 7, further comprising:
  generating a second plurality of audio signals based on the first plurality of audio signals, the second plurality of audio signals including the third audio data and the fourth audio data;
  determining, based on the third audio data having a highest signal quality metric value of the second plurality of audio signals, that the first audio signal corresponds to a target signal; and
  determining, based on the fourth audio data having a lowest signal quality metric value of the second plurality of audio signals, that the second audio signal corresponds to a reference signal,
wherein generating the fifth audio data further comprises:
  generating, using the speech mask data and the adaptive filter, the fifth audio data by subtracting the reference signal from the target signal, wherein the adaptive filter coefficients of the adaptive filter are updated based on the speech mask data.

11. The computer-implemented method of claim 7, further comprising:
  generating a second plurality of audio signals based on the first plurality of audio signals, the second plurality of audio signals including the third audio data and the fourth audio data;
  determining, based on the third audio data having a highest echo-return loss enhancement (ERLE) value of the second plurality of audio signals, that the first audio signal corresponds to a target signal; and
  determining, based on the fourth audio data having a lowest ERLE value of the second plurality of audio signals, that the second audio signal corresponds to a reference signal,
wherein generating the fifth audio data further comprises:
  generating, using the speech mask data and the adaptive filter, the fifth audio data by subtracting the reference signal from the target signal, wherein the adaptive filter coefficients of the adaptive filter are updated based on the speech mask data.

12. The computer-implemented method of claim 7, further comprising:
  setting, in response to determining that speech is not detected in the first portion of the third audio data, a second value in the speech mask data, the second value indicating that speech is not detected during the first time range.

13. The computer-implemented method of claim 7, wherein generating the fifth audio data further comprises:
  determining, using the speech mask data, that speech is not detected in the first time range;
  generating, using the adaptive filter, a first portion of the fifth audio data by subtracting a first portion of the second audio signal from a first portion of the first audio signal, wherein the first portion of the fifth audio data, the first portion of the first audio signal, and the first portion of the second audio signal correspond to the first time range, and wherein the adaptive filter updates the adaptive filter coefficients while generating the first portion of the fifth audio data;
  determining, using the speech mask data, that speech is detected in the second time range;
  determining a first set of respective values corresponding to the adaptive filter coefficients at a beginning of the second time range; and
  generating, using the adaptive filter and the first set of respective values, a second portion of the fifth audio data by subtracting a second portion of the second audio signal from a second portion of the first audio signal, wherein the second portion of the fifth audio data, the second portion of the first audio signal, and the second portion of the second audio signal correspond to the second time range.

14. The computer-implemented method of claim 7, wherein setting the first value in the speech mask data further comprises:
  detecting, using a first model, a representation of a wakeword included in the second portion of the third audio data, and
  setting the first value in the speech mask data.

15. A computer-implemented method, the method comprising:
  receiving first audio data associated with a first microphone;
  receiving second audio data associated with a second microphone;
  generating third audio data by subtracting the second audio data from the first audio data;
  generating fourth audio data by subtracting the first audio data from the second audio data;
  determining that speech is not detected in a first portion of the third audio data corresponding to a first time range;
  detecting that a second portion of the third audio data includes a representation of speech, the second portion of the third audio data corresponding to a second time range;
  setting a first value in speech mask data, the first value indicating that speech is detected during the second time range; and
  generating, using the speech mask data and an adaptive filter, fifth audio data by subtracting the second audio data from the first audio data.

16. The computer-implemented method of claim 15, further comprising:
  generating a plurality of audio signals based on the first audio data and the second audio data, the plurality of audio signals including the third audio data and the fourth audio data;
  determining, based on the third audio data having a highest signal quality metric value of the plurality of audio signals, that the first audio data corresponds to a target signal; and
  determining, based on the fourth audio data having a lowest signal quality metric value of the plurality of audio signals, that the second audio data corresponds to a reference signal,
wherein generating the fifth audio data further comprises:
  generating, using the speech mask data and the adaptive filter, the fifth audio data by subtracting the reference signal from the target signal, wherein the adaptive filter coefficients of the adaptive filter are updated based on the speech mask data.

17. The computer-implemented method of claim 15, wherein generating the fifth audio data further comprises:
  determining, using the speech mask data, that speech is not detected in the first time range;

generating, using the adaptive filter, a first portion of the fifth audio data by subtracting a first portion of the second audio data from a first portion of the first audio data, wherein the first portion of the fifth audio data, the first portion of the first audio data, and the first portion of the second audio data correspond to the first time range, and wherein the adaptive filter updates the adaptive filter coefficients while generating the first portion of the fifth audio data;

determining, using the speech mask data, that the speech is detected in the second time range;

determining a first set of respective values corresponding to the adaptive filter coefficients at a beginning of the second time range; and generating, using the adaptive filter and the first set of respective values, a second portion of the fifth audio data by subtracting a second portion of the second audio data from a second portion of the first audio data, wherein the second portion of the fifth audio data, the second portion of the first audio data, and the second portion of the second audio data correspond to the second time range.

* * * * *